United States Patent
Lee et al.

(10) Patent No.: US 7,615,496 B2
(45) Date of Patent: Nov. 10, 2009

(54) METHOD OF FORMING PAD PATTERNS USING SELF-ALIGN DOUBLE PATTERNING METHOD, PAD PATTERN LAYOUT FORMED USING THE SAME, AND METHOD OF FORMING CONTACT HOLES USING SELF-ALIGN DOUBLE PATTERNING METHOD

(75) Inventors: Ji-young Lee, Yongin-si (KR); Dae-hyun Jang, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 124 days.

(21) Appl. No.: 11/589,798

(22) Filed: Oct. 31, 2006

(65) Prior Publication Data
US 2008/0081461 A1    Apr. 3, 2008

(30) Foreign Application Priority Data
Oct. 2, 2006    (KR) ............... 10-2006-0097404

(51) Int. Cl.
*H01L 21/302* (2006.01)
*H01L 21/461* (2006.01)

(52) U.S. Cl. .............. 438/736; 438/947; 438/740; 257/E21.038

(58) Field of Classification Search ............ 438/736, 438/947, 945, 950, 737, 738, 740; 257/E21.033, 257/E21.038, E21.039
See application file for complete search history.

(56) References Cited

U.S. PATENT DOCUMENTS

| | | | |
|---|---|---|---|
| 6,063,688 A | 5/2000 | Doyle et al. | |
| 6,632,741 B1 * | 10/2003 | Clevenger et al. | 438/689 |
| 6,875,689 B2 | 4/2005 | Wu | |
| 2007/0158688 A1 * | 7/2007 | Caspary et al. | 257/208 |
| 2007/0161251 A1 * | 7/2007 | Tran et al. | 438/725 |

FOREIGN PATENT DOCUMENTS

| | | |
|---|---|---|
| KR | 10-0165399 B1 | 9/1999 |
| KR | 10-0574999 B1 | 4/2006 |

* cited by examiner

*Primary Examiner*—Caridad M Everhart
(74) *Attorney, Agent, or Firm*—Lee & Morse, P.C.

(57) ABSTRACT

A self-align patterning method for forming patterns includes forming a first layer on a substrate, forming a plurality of first hard mask patterns on the first layer, forming a sacrificial layer on top surfaces and sidewalls of the first hard mask patterns, thereby forming a gap between respective facing portions of the sacrificial layer on the sidewalls of the first hard mask patterns, forming a second hard mask pattern in the gap, etching the sacrificial layer using the second hard mask pattern as a mask to expose the first hard mask patterns, exposing the first layer using the exposed first hard mask patterns and the second hard mask pattern, and etching the exposed first layer using the first and second hard mask patterns.

21 Claims, 31 Drawing Sheets

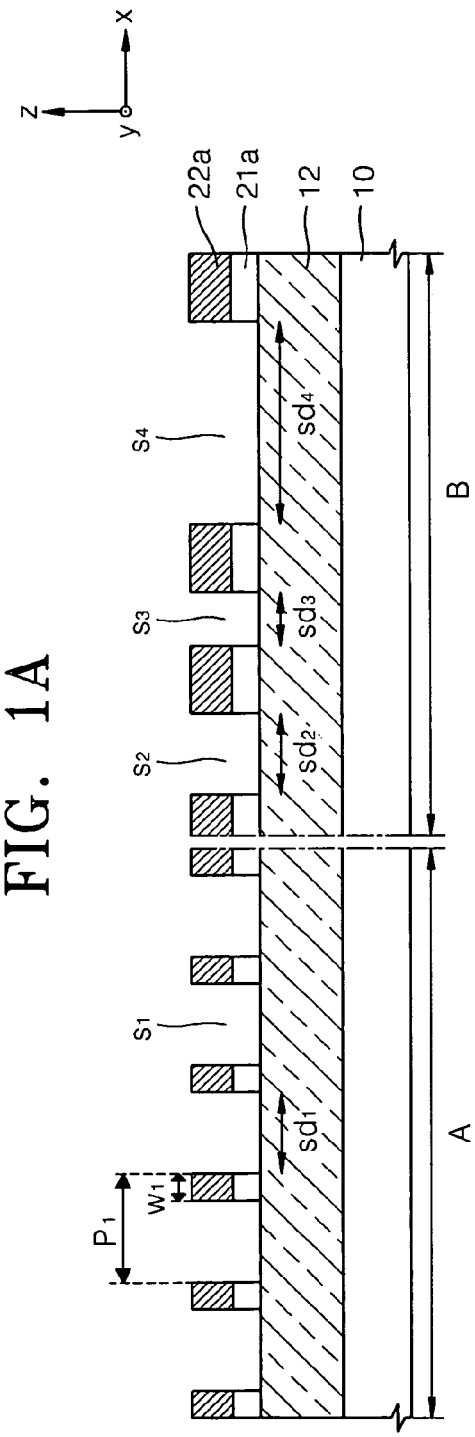
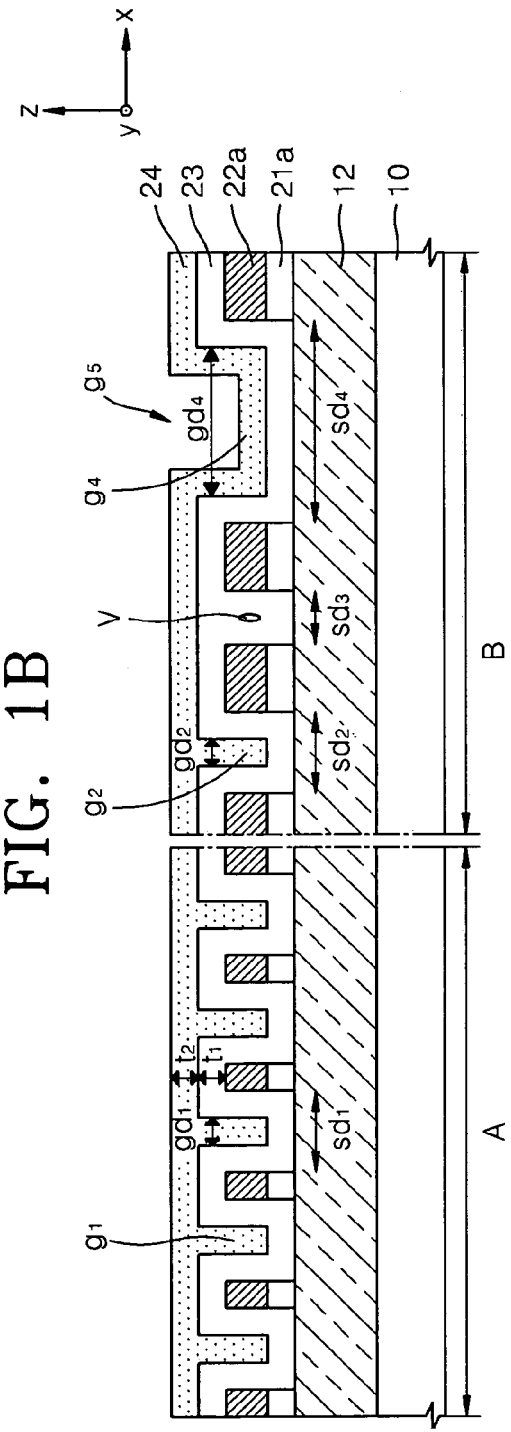

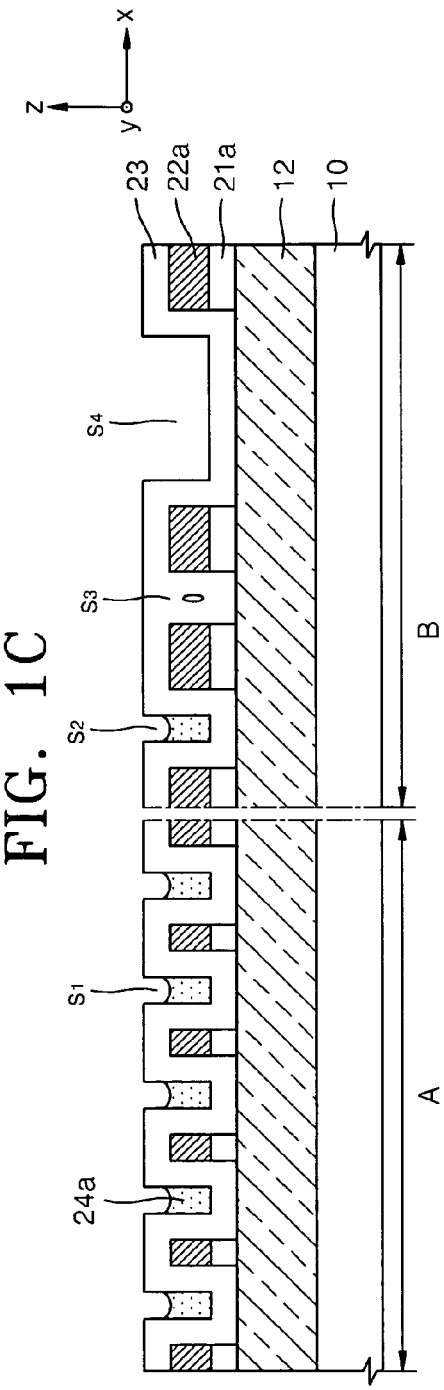
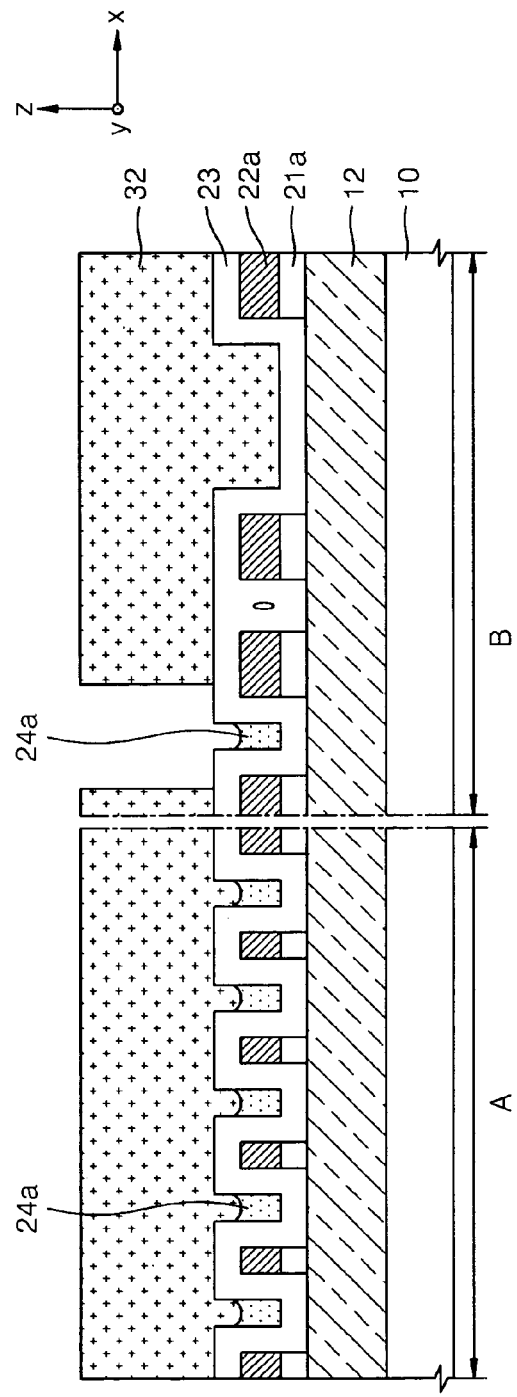

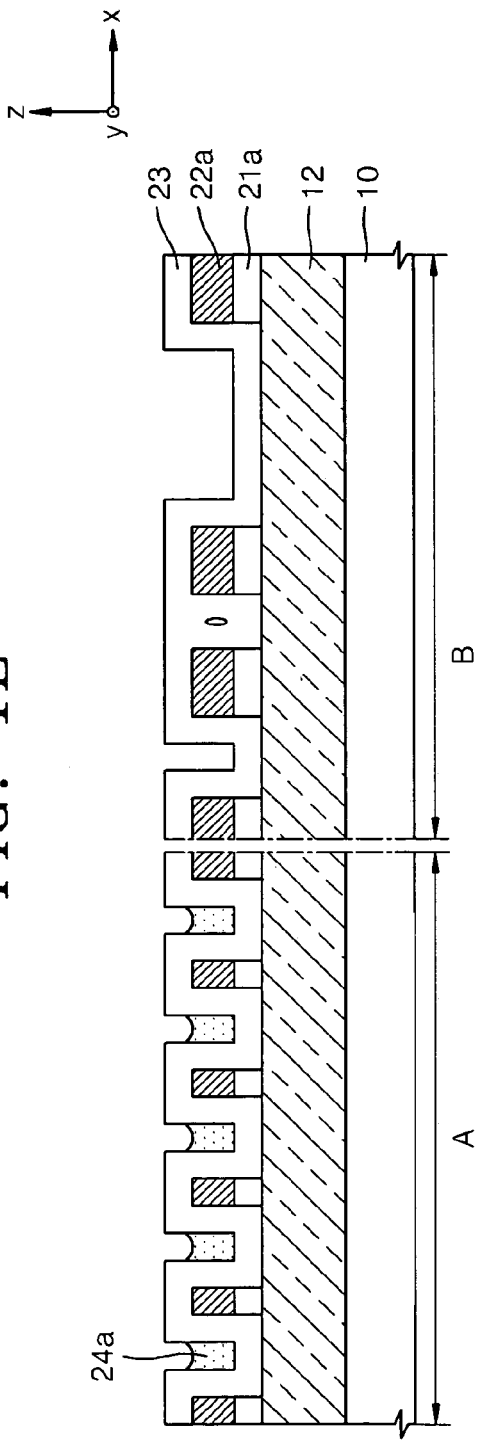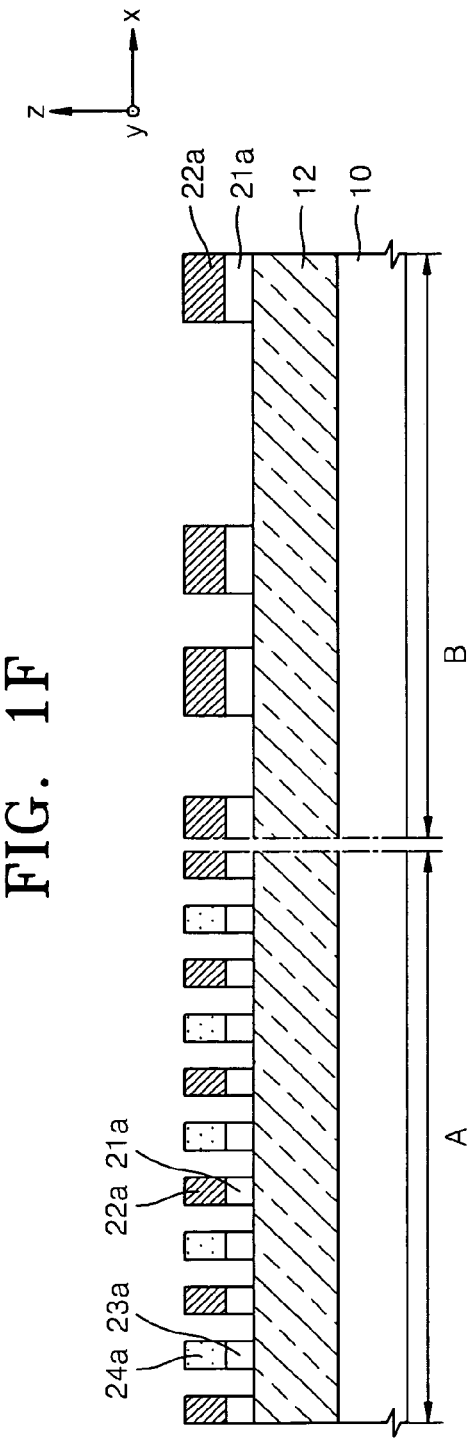

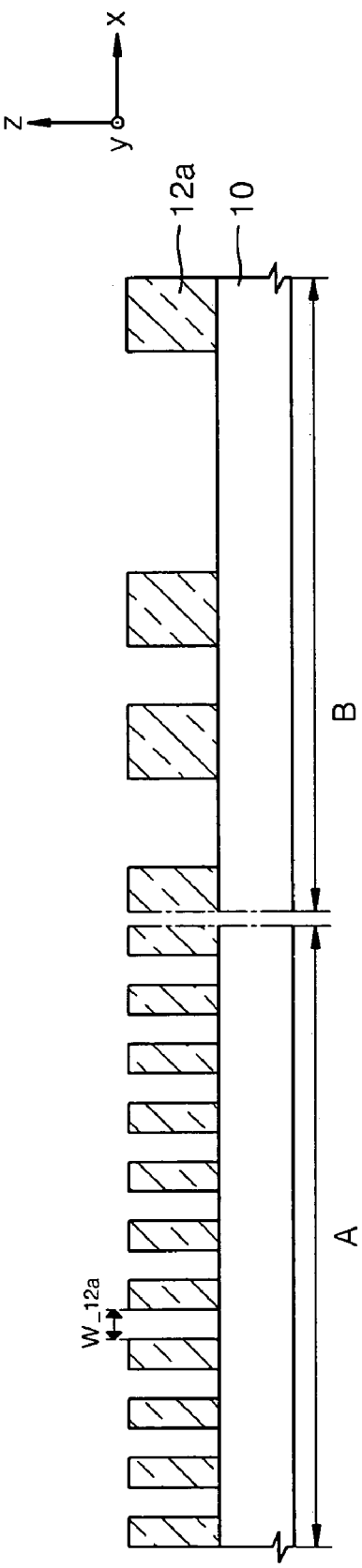

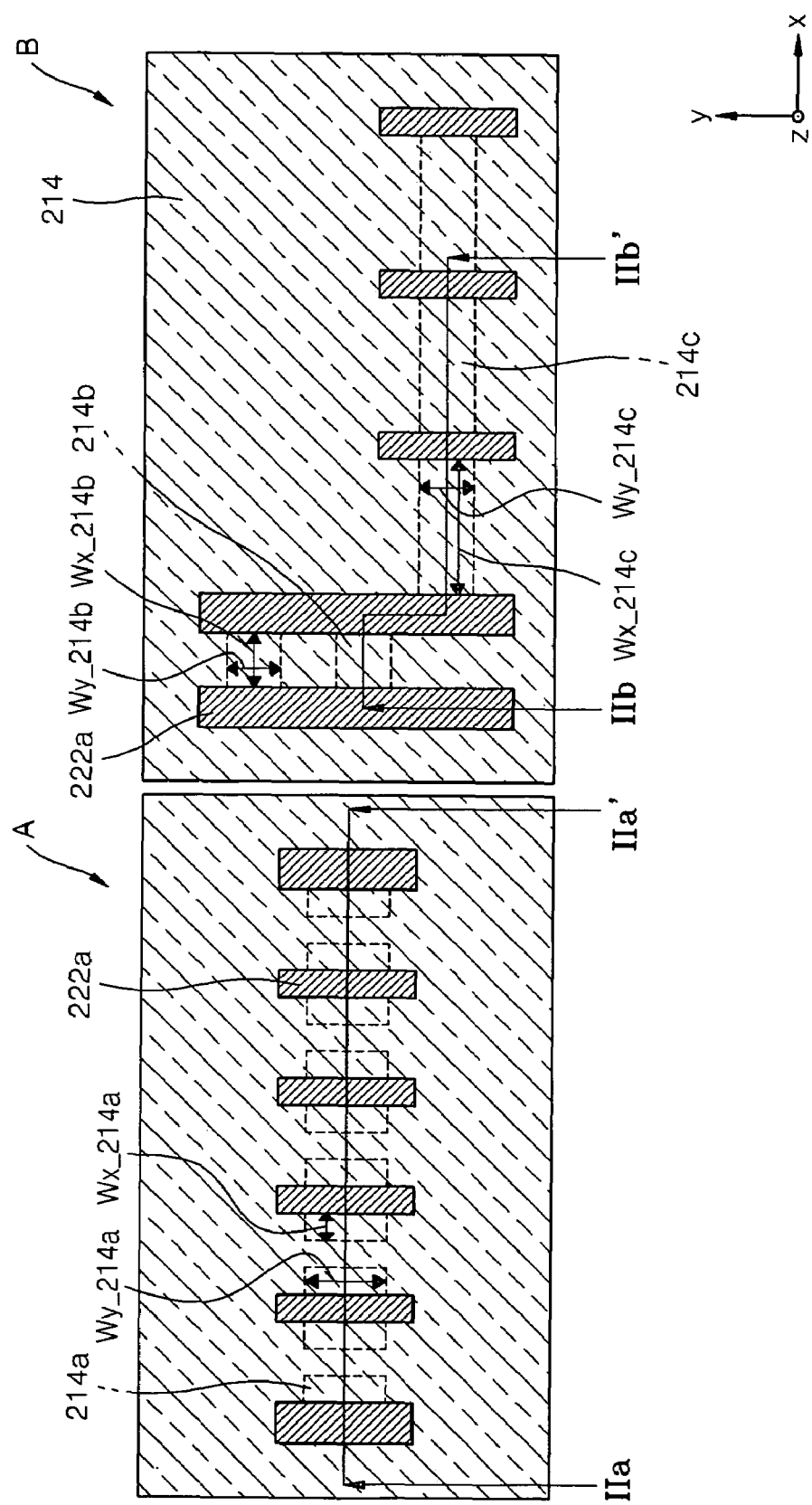

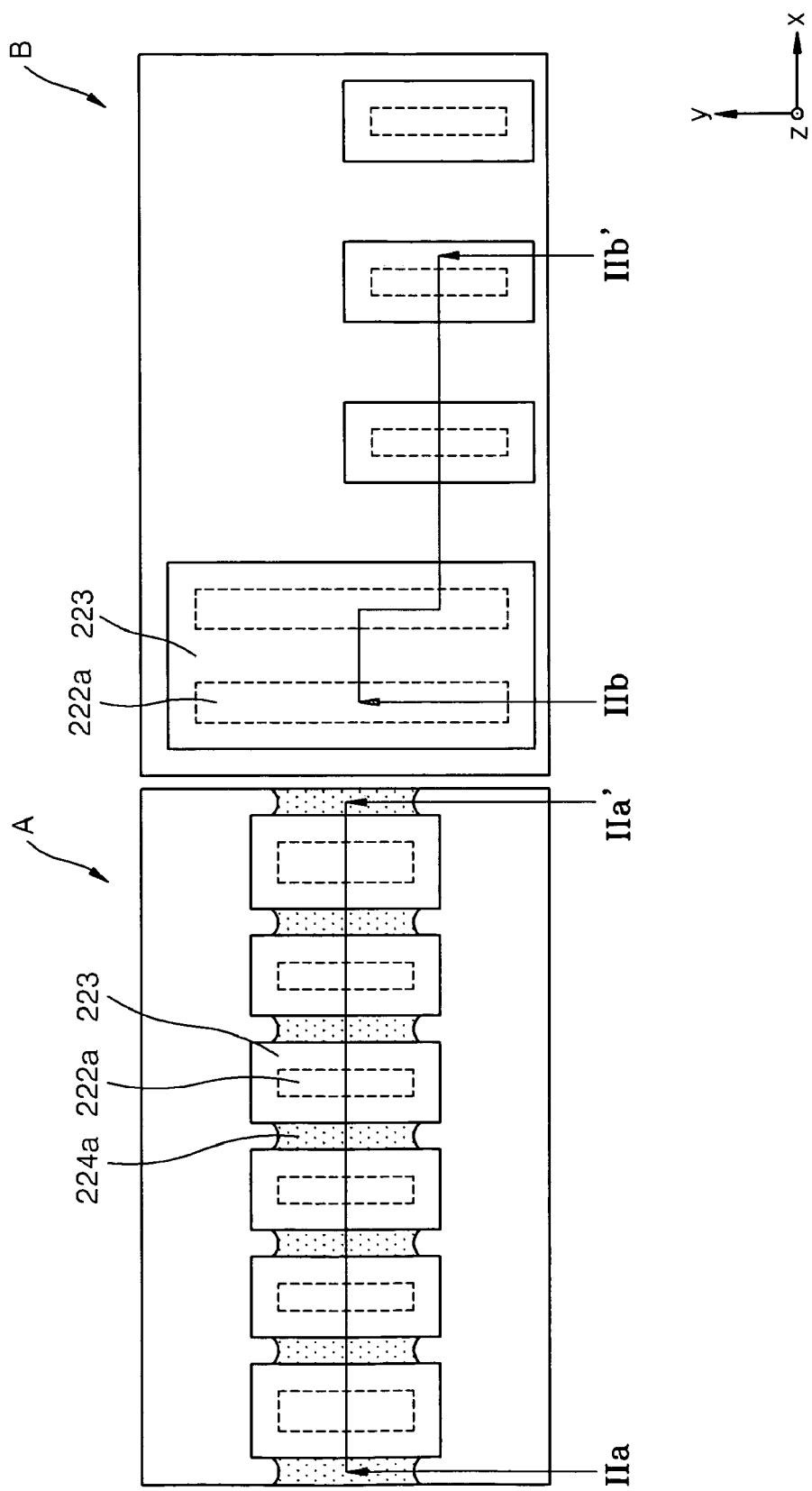

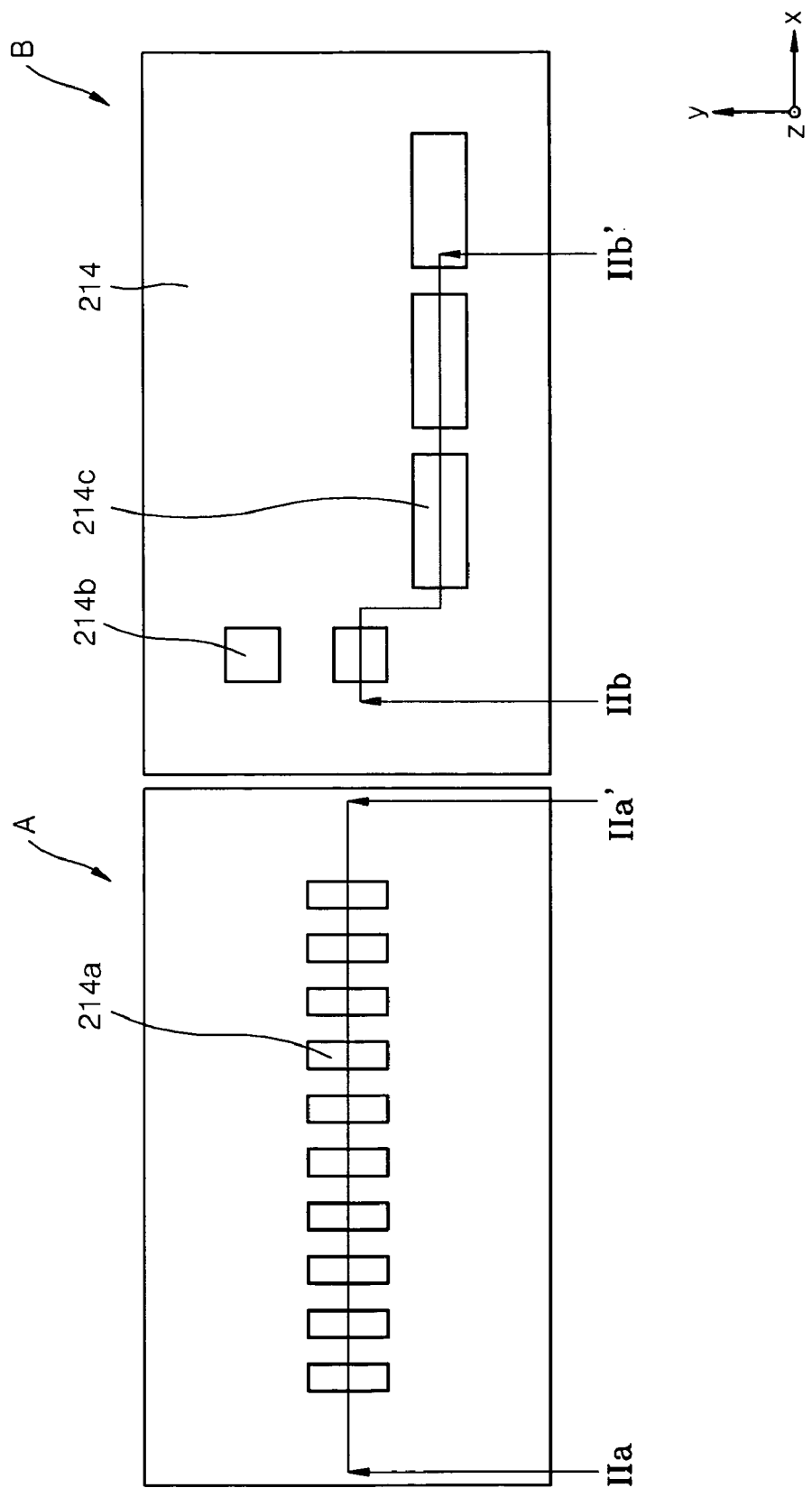

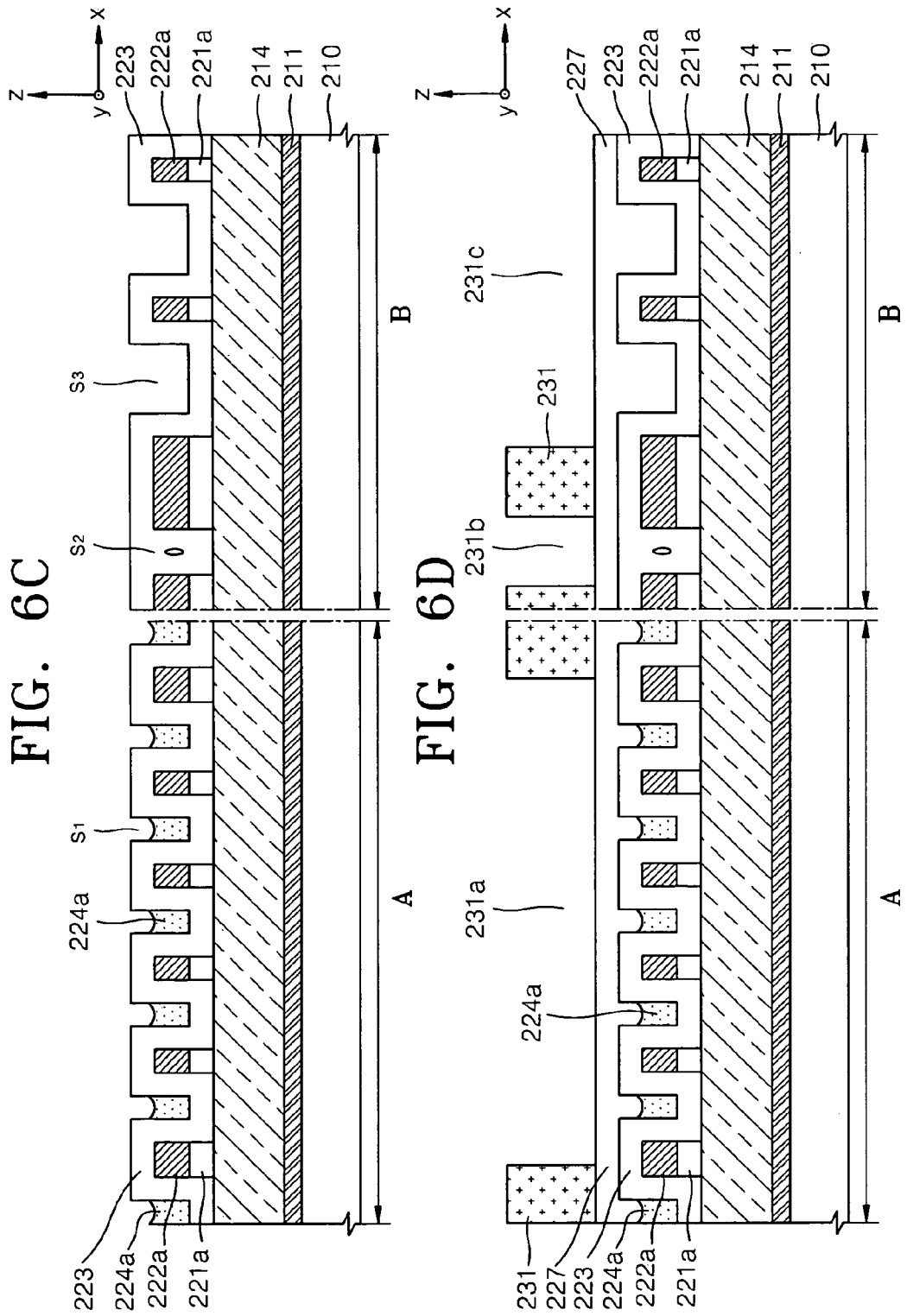

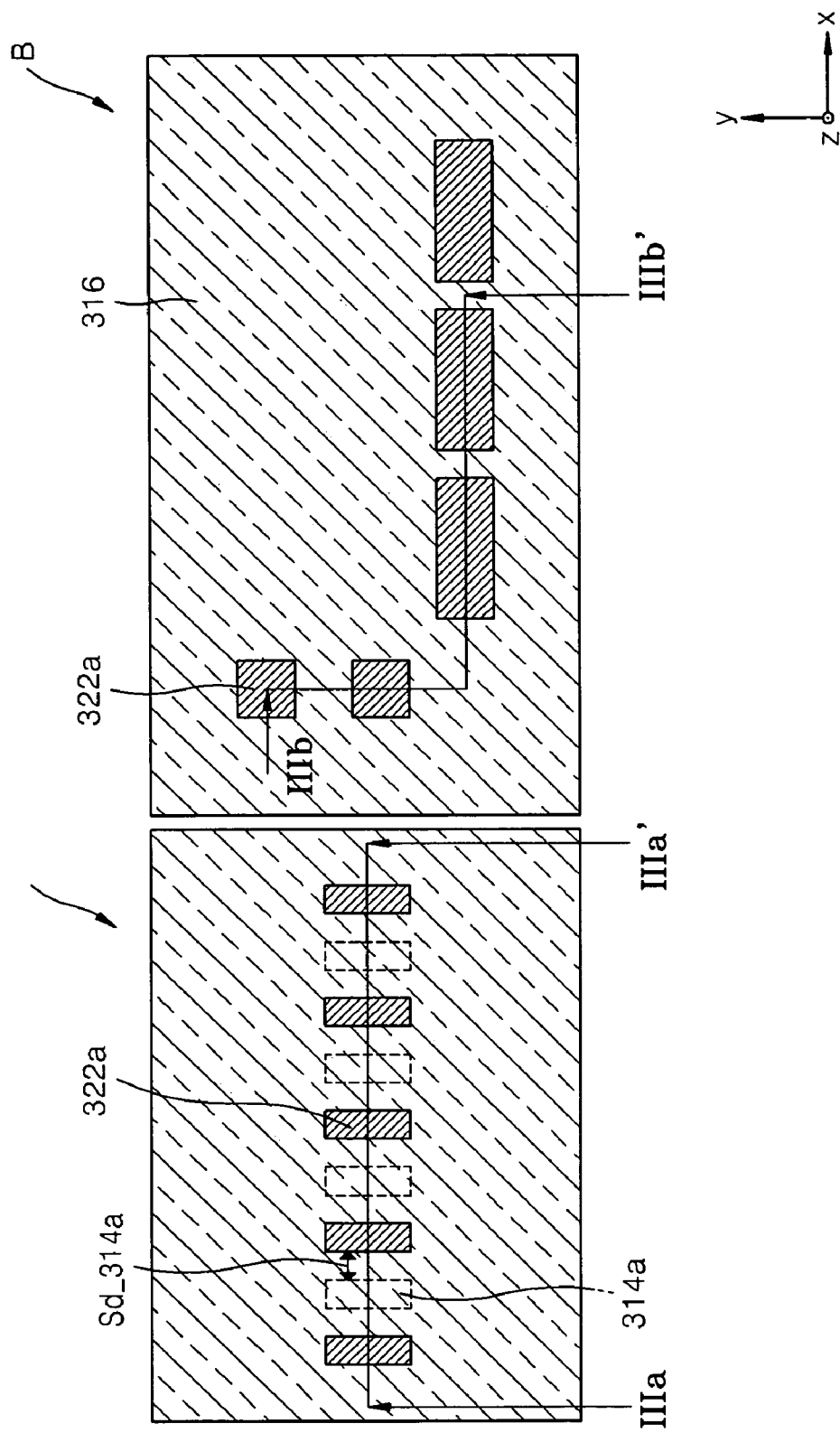

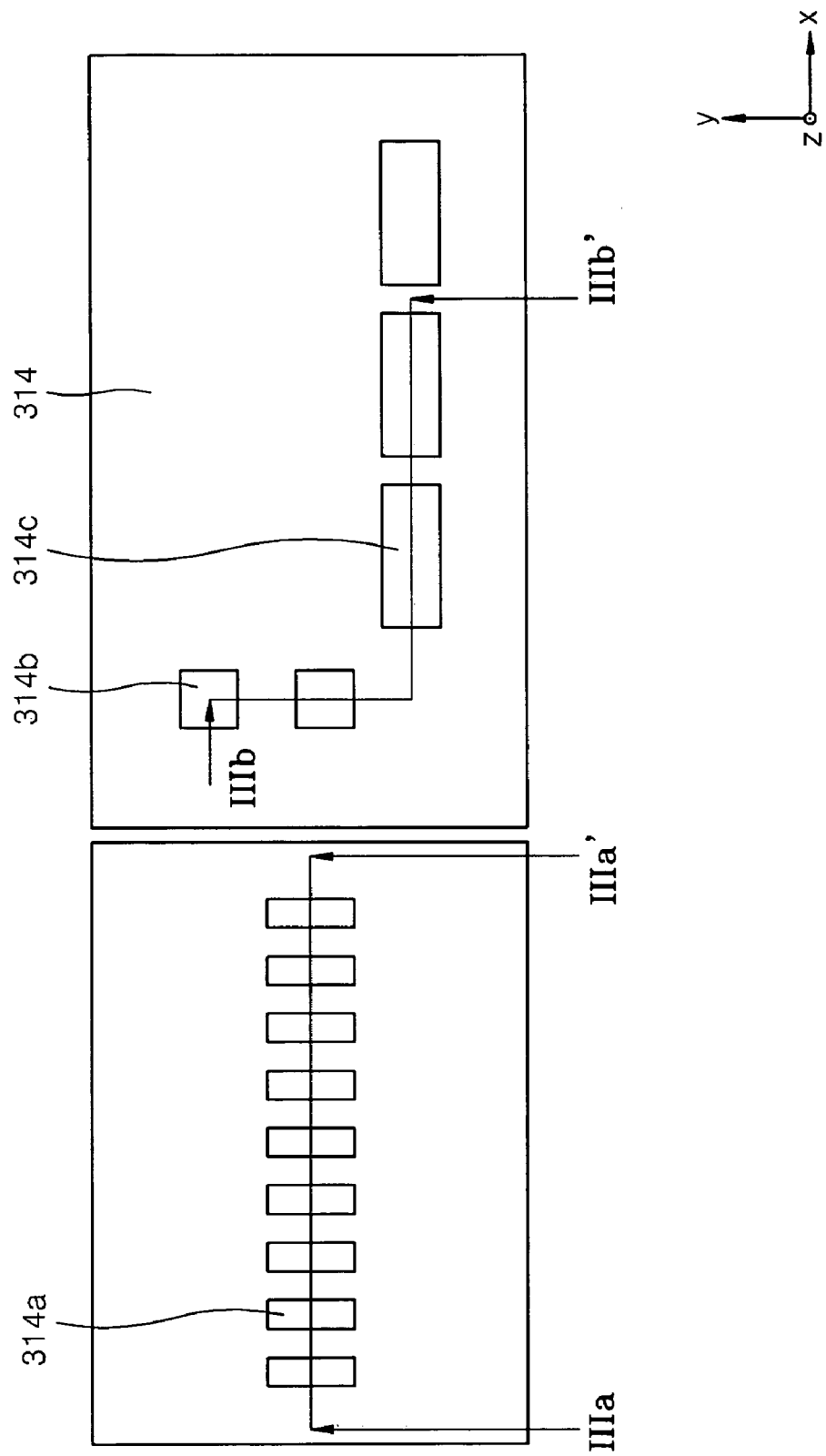

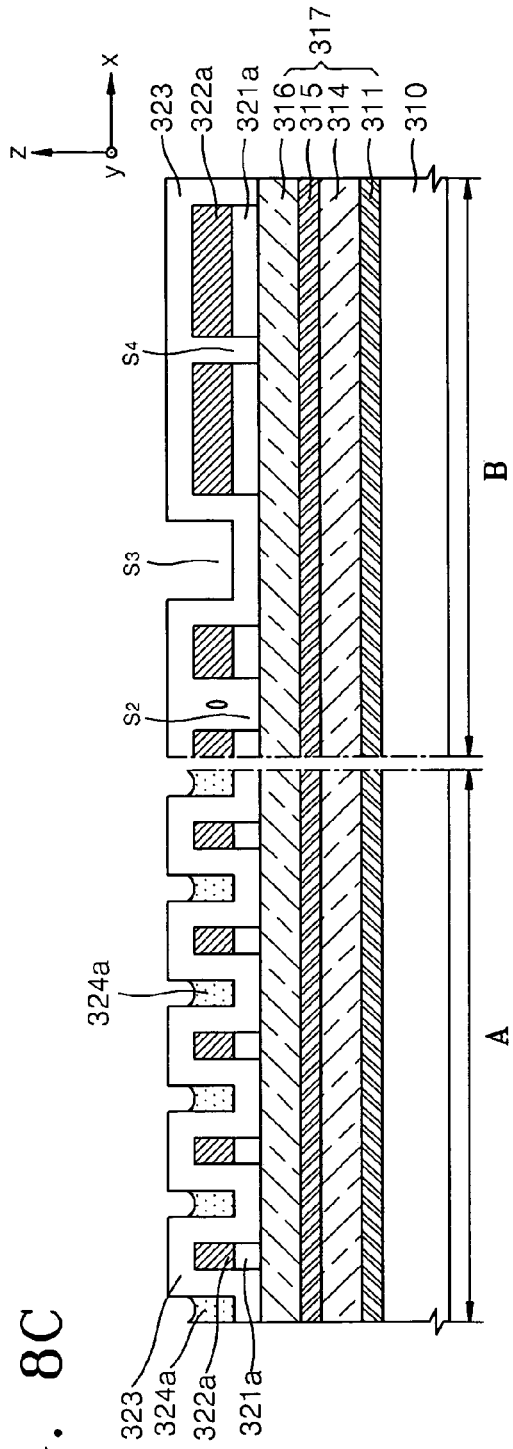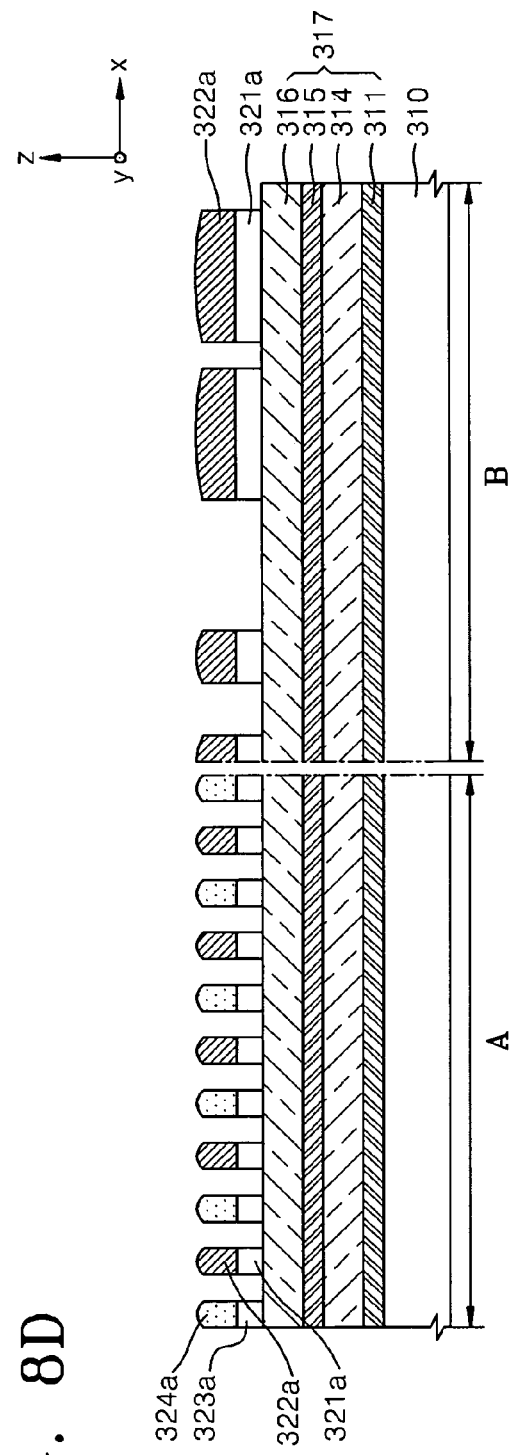

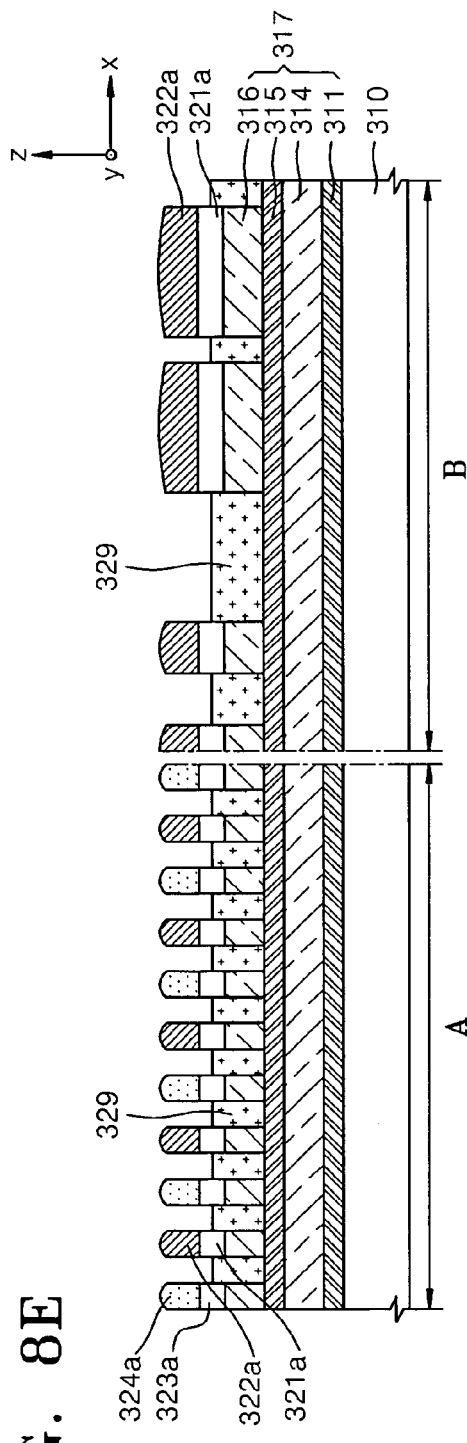
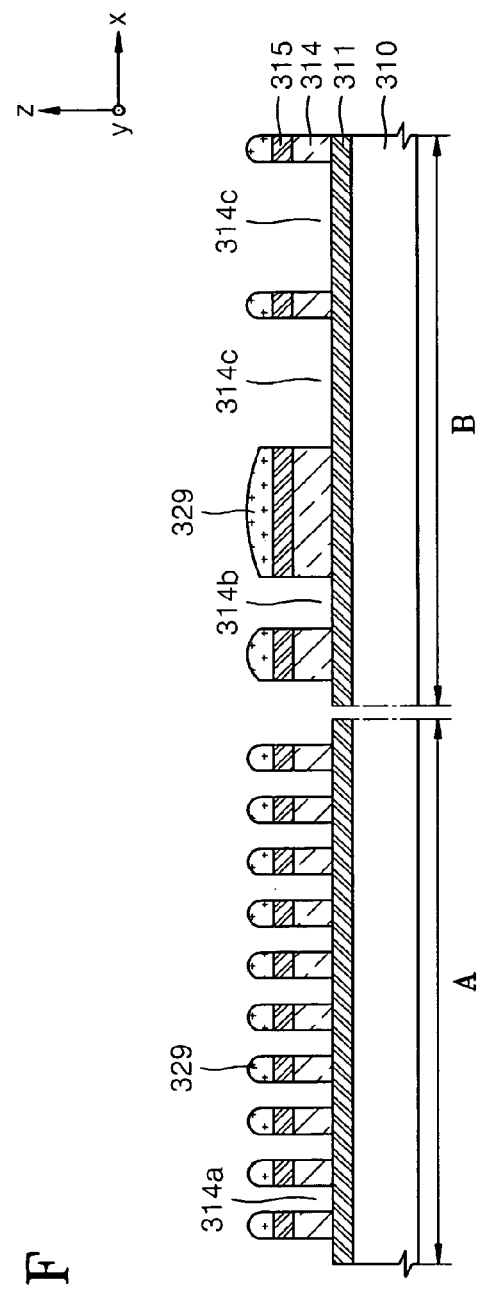

METHOD OF FORMING PAD PATTERNS USING SELF-ALIGN DOUBLE PATTERNING METHOD, PAD PATTERN LAYOUT FORMED USING THE SAME, AND METHOD OF FORMING CONTACT HOLES USING SELF-ALIGN DOUBLE PATTERNING METHOD

BACKGROUND OF THE INVENTION

1. Field of the Invention

The present invention relates to a method of manufacturing a semiconductor device. More particularly, the invention relates to a method of forming a pattern in a semiconductor device using a self-align double patterning method.

2. Description of the Related Art

Fine patterns should be formed for high-integration semiconductor devices. The size of devices should be reduced to form more devices in a give area. For this, the pitch of a pattern (the sum of the width and space width of a pattern) is to be reduced. As the design rule is drastically reduced, finer patterns are required in forming semiconductor devices.

However, it is difficult to form fine patterns in a semiconductor device using a conventional photolithography process due to the resolution limit of the photolithography process.

Technology suitable for forming various types of patterns, e.g., line patterns, pad patterns, and a contact hole patterns, including patterns having different patterns are desired.

SUMMARY OF THE INVENTION

The present invention provides a method of forming fine patterns in a semiconductor device at a resolution lower than the resolution limit of a photolithography.

The present invention also provides a method of forming fine patterns and patterns having various sizes and pitches in a semiconductor device.

The present invention further provides a method of forming contact holes at a resolution lower than the resolution limit of a photolithography process.

At least one of the above and other features and advantages of the present invention may be realized by providing a self-align patterning method for forming patterns, including forming a first layer on a substrate, forming a plurality of first hard mask patterns on the first layer, forming a sacrificial layer on top surfaces and sidewalls of the first hard mask patterns, thereby forming a gap between respective facing portions of the sacrificial layer on the sidewalls of the first hard mask patterns, forming a second hard mask pattern in the gap, etching the sacrificial layer using the second hard mask pattern as a mask to expose the first hard mask patterns, exposing the first layer using the exposed first hard mask patterns and the second hard mask pattern, and etching the exposed first layer using the first and second hard mask patterns.

The sacrificial layer may be formed by an atomic layer deposition method. Forming the second hard mask pattern may include forming a hard mask layer on the sacrificial layer while filling the gap with the hard mask layer, and isotropically etching the hard mask layer to expose the sacrificial layer. The isotropic etching may be wet etching. Each of the first and second hard mask patterns may include at least one of an oxide, a nitride, and a polysilicon. The first and second hard mask patterns may be polysilicon layers. The first layer may be a conductive layer.

Forming the plurality of first hard mask patterns may include forming the plurality of first hard mask patterns on the conductive layer, each of the respective first hard mask pattern including a first line mask pattern having a first line width and a first pad mask pattern having a second line width, the first pad mask pattern extending from the first line mask pattern, at least one of a distance between the first pad mask pattern and the first line mask pattern and a distance between the first pad mask patterns of neighboring ones of first hard mask patterns being greater than a distance between the first line mask patterns of neighboring ones of the first hard mask patterns. Forming the second hard mask pattern may include forming a second hard mask pattern in the gap, wherein the second hard mask pattern may include a second pad mask pattern and a second line mask pattern, the second pad mask pattern may be formed between the first pad mask pattern and the first line mask pattern or between the first pad mask patterns of the neighboring first hard mask patterns, and the second line mask pattern may be formed between the first line mask patterns of the neighboring first hard mask patterns. Etching the exposed first layer may include using the first and second hard mask patterns to form pad patterns.

The pad patterns may be uniformly spaced from each other. A distance between the pad patterns may correspond to a thickness of the sacrificial layer. Forming the first hard mask patterns may include forming an auxiliary pattern under each of the first hard mask patterns. The auxiliary pattern may have a same thickness as the sacrificial layer. The first layer may be an insulation layer.

The method may include forming a photoresist pattern on the second hard mask pattern, the photoresist pattern including a slit formed across the second hard mask pattern to expose a portion of the second hard mask pattern and portions of the sacrificial layer adjoining the second hard mask pattern, wherein forming the first layer may include forming the insulation layer on a substrate having a high-density pattern region and a low-density pattern region, forming the plurality of first hard mask patterns may include forming the plurality of first hard mask patterns on the insulation layer of the high-density pattern region, etching the sacrificial layer may include etching the sacrificial layer using the photoresist pattern and the second hard mask pattern as masks to expose the first hard mask patterns, exposing the first layer may include using the photoresist pattern, the second hard mask pattern, and the first hard mask patterns as masks to remove portions of the sacrificial layer located between the first and second hard mask patterns so as to expose the insulation layer, and etching the exposed first layer may include etching the exposed insulation layer using the photoresist pattern, the first hard mask patterns, and the second hard mask pattern as masks to form contact holes.

The first hard mask patterns may be formed on the insulation layer of the low-density pattern region, and a space width between the first hard mask patterns of the low-density pattern region may be such that the second hard mask pattern is not formed on the low-density pattern region.

The photoresist pattern may include an opening exposing a portion of the sacrificial layer located between the first hard mask patterns of the low-density pattern region.

The method may include forming a planarization film on the second hard mask layer prior to forming the photoresist pattern.

At least one of the above and other features and advantages of the present invention may be separately realized by providing a method of forming contact holes, including forming an insulation layer on a substrate, forming a plurality of first hard mask patterns on the insulation layer, forming a sacrificial layer on top surfaces and sidewalls of the first hard mask patterns, thereby forming a gap between the sacrificial layer formed on the neighboring sidewalls of the first hard mask patterns, forming a second hard mask pattern in the gap, etching the sacrificial layer using the second hard mask pattern as a mask to expose the first hard mask pattern and using the first and second hard mask patterns as masks to remove portions of the sacrificial layer located between the first and second hard mask patterns so as to expose the insulation layer, partially etching the exposed insulation layer using the first and second hard mask patterns as masks, forming a contact hole etch mask layer on the partially-etched insulation layer; and etching the first hard mask patterns, the second hard mask pattern, the sacrificial layer under the second hard mask pattern, and portions of the insulation layer under the first and second hard mask patterns by using the contact hole etch mask layer as an etch mask, so as to form contact holes in the insulation layer.

Forming the insulation layer may include forming a first insulation layer on the substrate, forming an etch stop layer on the first insulation layer, and forming a second insulation layer on the etch stop layer. Partially etching of the exposed insulation layer may include etching the second insulation layer to expose the etch stop layer. The contact hole etch mask layer may be an organic layer.

At least one of the above and other features and advantages of the present invention may be separately realized by providing a pad layout, including a plurality of first pad patterns formed on a substrate, each of the plurality of first pad patterns including a first line extending in a predetermined direction and a first pad extending from the first line, and a second pad pattern formed between the first pad patterns, the second pad pattern including a second line and a second pad extending from the second line, wherein the second line is formed between the first lines of the neighboring first pad patterns, the second pad may be formed between the first pad and the first line or between the first pads of the neighboring first pad patterns, and the first pad pattern and the second pad pattern are uniformly spaced from each other

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIGS. 1A through 1G illustrate cross-sectional views of resulting structures obtained during stages of a first exemplary method of forming a line pattern in a semiconductor device according to one or more aspects of the present invention;

FIGS. 5A through 5F illustrate plan views of resulting structures obtained during an exemplary method of forming a contact hole pattern according to an embodiment of the present invention;

FIGS. 6A through 6F respectively illustrate cross-sectional views of the resulting structures taken along each of lines IIa-IIa' and IIb-IIb' of FIGS. 5A through 5F;

FIGS. 7A through 7G illustrate plan views of resulting structures obtained during another exemplary method of forming a contact hold pattern according to one or more aspects of the present invention; and FIGS. 8A through 8G respectively illustrate cross-sectional views of the resulting structures taken along each of lines IIIa-IIIa' and IIIb-IIIb' of FIGS. 7A through 7G.

DETAILED DESCRIPTION OF THE INVENTION

Figure 2A:
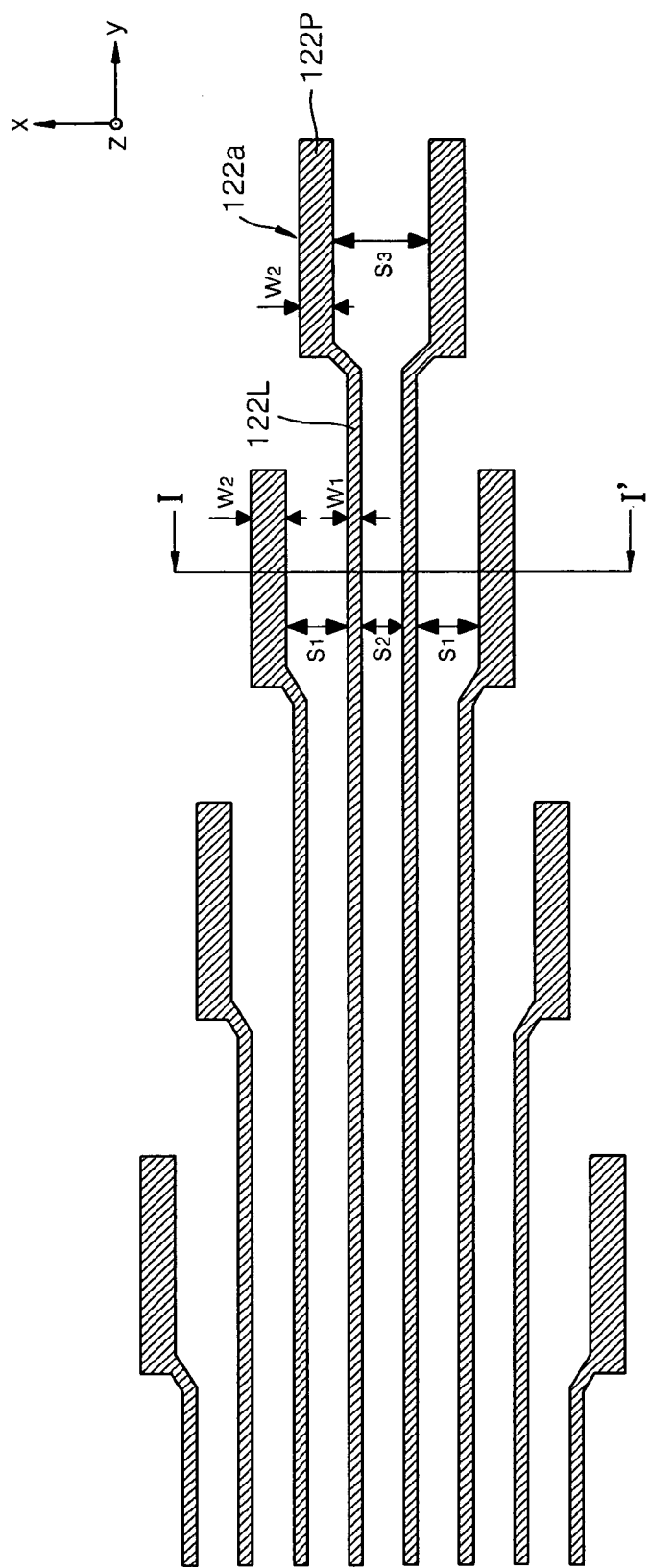
FIGS. 2A through 2C illustrate partial layout diagrams of layers formed during stages of an exemplary method of forming a pad pattern according to one or more aspects of the present invention.

Korean Patent Application No. 10-2006-0097404, filed on Oct. 2, 2006, in the Korean Intellectual Property Office, and entitled: "Method of Forming Pad Patterns Using Self-Align Double Patterning Method, Pad Pattern Layout Formed Using the Same, and Method of Forming Contact Holes Using Self-Align Double Patterning Method," is incorporated by reference herein in its entirety.

The invention will now be described more fully hereinafter with reference to the accompanying drawings, in which exemplary embodiments of the present invention are illustrated. The invention may, however, be embodied in different forms and should not be construed as limited to the embodiments set forth herein. Rather, these embodiments are provided so that this disclosure will be thorough and complete, and will fully convey the scope of the present invention to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. Further, it will be understood that when a layer is referred to as being "under" another layer or element, it can be directly under, and one or more intervening layers or elements may also be present. In addition, it will also be understood that when a layer or element is referred to as being "between" two layers or elements, it can be the only layer between the two layers or elements, or one or more intervening layers or elements may also be present.

The invention will now be described more fully with reference to the accompanying drawings, in which exemplary embodiments of the present invention are shown. The invention may, however, be embodied in many different forms and should not be construed as being limited to the embodiments set forth herein; rather, these embodiments are provided so that this disclosure will be thorough and complete, and will fully convey the concept of the present invention to those skilled in the art. In the drawings, the thicknesses of films or regions may be exaggerated for clarity. Like reference numerals in the drawings denote like elements, and thus their description will be omitted.

FIGS. 1A through 1G illustrate cross-sectional views of resulting structures obtained during stages of a first exemplary method of forming a line pattern in a semiconductor device using a self-align double patterning method employing one or more aspects of the invention.

Referring to FIG. 1A, a semiconductor substrate 10 with a high-density pattern region (A) and a low-density pattern region (B) may be provided. In the high-density pattern region (A), islands having a same width may be repeatedly formed, and in the low-density pattern region (B), islands having various widths may be formed. A cell array region of a memory device may include the high-density pattern region (A). In some cases, the cell array region of a memory device may include the low-density pattern region (B). A peripheral circuit region of the memory device may include the low-density pattern region (B).

An etch layer 12 may be formed on the substrate 10. The etch layer 12 may be formed of various materials depending, e.g., on a target pattern to be formed in the etch layer 12. For example, when the target pattern is an active region pattern, the etch layer 12 may be a silicon layer. When the target pattern is a gate electrode pattern, the etch layer 12 may be a conductive layer, such as a doped polysilicon layer or a stacked structure with a doped polysilicon layer and a metal silicide layer. When the target pattern is a signal line pattern such as a data line pattern or a power line pattern, the etch layer 12 may be a metal layer, such as a tungsten layer or an aluminum layer.

An auxiliary layer (not shown) and a first hard mask layer (not shown) may be sequentially formed on the etch layer 12. A photoresist pattern (not shown) may be formed on the first hard mask layer through a first photolithography process. The first hard mask layer and the auxiliary layer may be sequentially patterned by, e.g., anisotropic etching using the photoresist pattern as a mask to form a plurality of first hard mask patterns 22a and a plurality of auxiliary patterns 21a, respectively. Each of auxiliary patterns 21a and each of first hard mask patterns 22a may be sequentially stacked, and each of the first hard mask patterns 22a may be stacked on one of the auxiliary patterns 21a. The photoresist pattern may then be removed. In some cases, an anti-reflective layer (not shown) may be formed on the first hard mask layer before the photoresist pattern is formed.

The first hard mask layer may be formed of a material having a high etch selectivity relative to the etch layer 12. For example, the first hard mask layer may be one of an oxide layer, a nitride layer, and a polysilicon layer depending on the material of the etch layer 12. More particularly, e.g., the first hard mask layer may be a polysilicon layer in which a vertical profile can be formed by etching.

Referring to FIG. 1A, in the high-density pattern region (A), the first hard mask patterns 22a may be disposed at a constant pitch along the X direction, and may have same widths and space widths along the X direction, i.e., widths of spaces between adjacent ones of the first hard mask patterns 22a along the X direction may be the same in the high-density pattern region (A), and in the low-density pattern region (B), the first hard mask patterns 22a may be disposed at different pitches along the X direction, and may have different widths and space widths along the X direction, i.e., widths of spaces between adjacent ones of the first hard mask patterns 22a along the X direction may not be the same in the low density pattern region (B).

The first hard mask patterns 22a may have a minimal pitch $P_1$ in the high-density pattern region (A), and the minimal pitch $P_1$ may correspond to a limiting resolution of the photolithographic process used to form the first hard mask patterns 22a. As shown in FIG. 1A, in the high-density pattern region (A), the first hard mask patterns 22a may have a pitch $P_1$ and a width $W_1$ in the high-density pattern region (A), and the pitch $P_1$ may be four times the width $W_1$ ($P_1=4W_1$). In the high-density pattern region (A), the first hard mask patterns 22a may have, e.g., first spaces $S_1$ between adjacent ones of the first hard mask patterns 22a along the X direction, and the first spaces $S_1$ may have a first space width $sd_1$. In the low-density pattern region (B), the first hard mask patterns 22a may have, e.g., second, third and fourth spaces $S_2$, $S_3$, and $S_4$ between respective adjacent ones of the first hard mask patterns 22a along the X direction, and the second, third and fourth spaces $S_2$, $S_3$, $S_4$ may have second, third and fourth space widths $sd_2$, $sd_3$, and $sd_4$. In embodiments of the invention, the second space width $sd_2$ may be equal to the first space width $sd_1$, the third space width $sd_3$ may be smaller than the first space width $sd_1$, and the fourth space width $sd_4$ may be larger than the first space width $sd_1$. Although first, second, third and fourth spaces $S_1$, $S_2$, $S_3$, and $S_4$ and first, second, third and fourth space widths $sd_1$, $sd_2$, $sd_3$, and $sd_4$ are illustrated, embodiments of the invention are not limited to such an embodiment.

Referring to FIG. 1B, a sacrificial layer 23 may be formed on the substrate 10, including the first hard mask patterns 22a. The sacrificial layer 23 may uniformly cover top surfaces and sidewalls of the first hard mask patterns 22a, sidewalls of the auxiliary patterns 21a and exposed portions of the etch layer 12. That is, the sacrificial layer 23 may be a conformal layer that has good step coverage characteristics and is not affected by the density of a lower pattern. The sacrificial layer 23 may be formed by, e.g., an atomic layer deposition method.

The sacrificial layer 23 may have a thickness $t_1$ determined by a space width $W\_12a$ (refer to FIG. 1G) of a target pattern to be formed in the high-density pattern region (A). A gap $g_1$ may be formed between respective portions of the sacrificial layers formed on neighboring ones of the sidewalls of the first hard mask patterns of the high-density pattern region (A). A gap width $gd_1$, i.e., the distance between respective portions of the sacrificial layer 23 formed on neighboring ones of the sidewalls of the first hard mask patterns may be determined by a line width of the target pattern (refer to FIG. 1G) to be formed in the first spaces $S_1$.

In embodiments of the invention, when the sacrificial layer 23 has a uniform thickness $t_1$ on the top surfaces and sidewalls of the first hard mask patterns 22a, the thickness $t_1$ may be equal to the gap width $gd_1$ and the width $W_1$ of the first hard mask pattern 22a ($t_1=gd_1=W_1$). The third space width $sd_3$ of the first hard mask patterns 22a in the low-density pattern region (B) may be equal to or smaller than twice the thickness $t_1$ of the sacrificial layer 23 ($sd_3 \leq 2t_1$). In such cases, a gap may not be formed between the sacrificial layer 23 located in the third space $S_3$ between respective portions of the sidewalls of the first hard mask patterns 22a. Instead, a void (V) may be formed in the third space $S_3$. However, in the second and fourth spaces $S_2$ and $S_4$, gaps $g_2$ and $g_4$ may be formed.

A second hard mask layer 24 may be formed on the sacrificial layer 23. The second hard mask layer 24 may be formed of a material having etching characteristics similar to those of the first hard mask layer. For example, the second hard mask layer 24 may be formed of the same material as the first hard mask layer or a material having etching characteristics similar to those of the first hard mask layer. In embodiments of the invention, e.g., the first hard mask layer may be formed of a nitride layer, and the second hard mask layer 24 may be formed of a polysilicon layer, or vice versa. In other embodiments, the first hard mask layer and the second hard mask layer 24 may be formed of a polysilicon layer suitable for obtaining a vertical etch profile.

The second hard mask layer 24 may have a sufficient thickness $t_2$ for filling the gap $g_1$ of the sacrificial layer 23 in the high-density pattern region (A). In such embodiments, the gaps $g_1$ and $g_2$ formed between respective portions of the sacrificial layer 23 in the first and second spaces $S_1$ and $S_2$ may be filled with the second hard mask layer 24, and as there may be no gap formed by the sacrificial layer 23 in the third space $S_3$, the second hard mask layer 24 may not fill the third space $S_3$, e.g., may not fill any portion of the third space $S_3$ directly between respective ones of the first hard mask patterns 22a defining the third space $S_3$. In the fourth space $S_4$, the second hard mask layer 24 may be formed along with the sacrificial layer 23, and respective portions of the second hard mask layer 24 may define a gap $g_5$. More particularly, e.g., in embodiments in which the sacrificial layer 23 and the second hard mask layer 24 each have a substantially uniform thickness $t_1$, $t_2$, respectively, along both the XY plane parallel to the substrate 10 and the sidewalls of the first hard mask patterns 22a defining the fourth space $S_4$, the fourth space width $sd_4$ may be larger than or equal to twice the sum of the thickness $t_1$ of the sacrificial layer 23 and the thickness $t_2$ of the second hard mask layer 24 ($sd_4 > 2(t_1 + t_2)$).

Referring to FIG. 1B, the auxiliary layer 21a may be formed such that the first hard mask patterns 22a and the second hard mask layer 24 may be formed to at least partially overlap each other along the X direction, i.e., may extend along a same X-Y plane. Thus, the auxiliary layer 21a may have a thickness equal to the thickness $t_1$ as the sacrificial layer 23. Further, because the auxiliary layer 21a and the sacrificial layer 23 may be removed in the same process, the auxiliary layer 21a and the sacrificial layer 23 may have the same etching characteristics. For example, the auxiliary layer 21a and the sacrificial layer 23 may be formed of an oxide layer or a nitride layer. Furthermore, in embodiments of the invention, the auxiliary layer 21a and the sacrificial layer 23 may be formed of a material having the same etching characteristic as the etch layer 12.

Referring to FIG. 1C, the second hard mask layer 24 may be partially removed by isotropic etching such that at least upper surfaces of the sacrificial layer 23 overlapping the first hard mask patterns 22a along the Z direction may be exposed, and second hard mask patterns 24a may be formed. In embodiments of the invention, the second hard mask layer 24 may be completely removed from the fourth space $S_4$ because the fourth space $S_4$ may not have been completely filled prior to etching of the second hard mask layer, e.g., the fourth space $S_4$ directly between respective portions of the sacrificial layer may not have been completely filled even after formation of the second hard mask layer 24. However, portions of the second hard mask layer 24 in the first and second spaces $S_1$ and $S_2$ may remain because the first and second spaces $S_1$ and $S_2$ may have been completely filled during prior processing, e.g., formation of the second hard mask layer 24.

As shown in FIG. 1C, the second hard mask patterns 24a may overlap the first hard mask patterns 22a along the X direction, and may extend parallel to the first hard mask patterns 22a. The second hard mask patterns 24a may be formed such that the first hard mask patterns 22a and the second hard mask patterns 24a may extend along the same X-Y plane(s). Further, in embodiments of the invention, the first hard mask patterns 22a and the second hard mask patterns 24a may substantially completely overlap each other along the X direction.

The isotropic etching for etching, e.g., portions of the second hard mask layer may involve wet etching. In such cases, when the second hard mask layer 24 is a nitride layer, a phosphate solution may be used as an etch solution. When the second hard mask layer 24 is an oxide layer, an HF solution, an $H_2SO_4$ solution, a mixed solution of $NH_4OH$ and $H_2O_2$ (hereinafter, referred to as an SC-1 solution), or a mixed solution of $NH_4F$ and HF (hereinafter, referred to as an LAL solution) may be used as an etch solution. When the second hard mask layer 24 is a polysilicon layer, a mixed solution of $HNO_3$ and SC-1 may be used as an etch solution.

FIGS. 1D and 1E illustrate views of resulting structures formed during a process of removing one of the second hard mask patterns 24a formed in the second space $S_2$ when such a portion(s) is not required.

Although FIGS. 1D and 1E illustrate a single one of the second hard mask patterns 24a being removed, in embodiments of the invention, none or more than one of such second hard mask patterns 24a may be removed.

A photoresist pattern 32 may be formed on the sacrificial layer 23 and the second hard mask pattern 24 using, e.g., a second photolithography process. The portion(s) of the second hard mask pattern 24a formed in the second space $S_2$ that are intended to be removed, may remain exposed by a pattern of the photoresist pattern 32. It is apparent that a pattern pitch formed in the second photolithography process is larger than that formed in the first photolithography process.

In the exemplary embodiment illustrated in FIGS. 1D and 1E, the portion of the second hard mask pattern 24a formed in the second space $S_2$ remains exposed by the photoresist pattern 32, and is removed using the photoresist pattern 32 as a mask. After the portion of the second hard mask pattern 24a that remained exposed is removed, the photoresist pattern 32 may be removed. The resulting structure is shown in FIG. 1E.

Referring to FIG. 1F, the sacrificial layer 23 may be etched by an anisotropic etching method using the second hard mask pattern 24a as an etch mask, thereby exposing the first hard mask patterns 22a. Then, the sacrificial layer 23 is further etched by an anisotropic etching method using the second hard mask pattern 24a and the exposed first hard mask patterns 22a as etching masks until respective portions of the etch layer 12 are exposed. As a result, in the high-density pattern region (A), a sacrificial pattern 23a stacked under the second hard mask pattern 24a between the first hard mask patterns 22a may be formed, and the etch layer 12 may be exposed between the first and second hard mask patterns 22a and 24a.

Still referring to FIG. 1F, in the low-density pattern region (B), the etch layer 12 may be exposed between the first hard mask patterns 22a.

Referring to FIG. 1G, the etch layer 12 may then be patterned by, e.g., an anisotropic etch process using the first and second hard mask patterns 22a and 24a as an etch mask. Thereby, a device pattern 12a may be formed.

As explained above, after the first hard mask patterns 22a are formed, the second hard mask pattern 24a may be formed in complete or substantial alignment with the first hard mask patterns 22a. Then, the etch layer 12 may be patterned using the first and second hard mask patterns 22a and 24a as etch masks. In this way, a fine-pitch pattern may be formed in the high-density pattern region (A) at a resolution lower than the resolution limit of a photolithography process. Such a pattern transfer method may be called a self-align double patterning method.

In embodiments of the invention, in the low-density pattern region (B), the second hard mask pattern 24a may not be formed by adjusting the space widths of the first hard mask patterns 22a or by performing an additional photolithography process. Therefore, in the low-density pattern region (B), the etch layer 12 may be patterned using only the first hard mask patterns 22a, so that the device pattern 12a may have various space widths and pitches.

Meanwhile, in the exemplary embodiment illustrated in FIGS. 1A-1G, in forming the device pattern 12a, the second hard mask pattern 24a may be formed between adjacent ones of the first hard mask patterns 22a in the high-density pattern region (A). Therefore, in embodiments of the invention, a number of islands of the first and second hard mask patterns 22a and 24a may be odd, and thus, a number of islands of the device pattern 12a may be odd. However, when it is intended to form, using the first and second hard mask patterns 22a and 24a, a device pattern 12a having an even number of islands, one of the islands of the device pattern 12a may be formed into a dummy island. Further, in the exemplary embodiment illustrated in FIGS. 1A-1G, the first and second hard mask patterns 22a and 24a have the same or substantially the same line width in the high-density pattern region (A). However, the first and second hard mask patterns 22a and 24a may have different line widths in the high-density pattern region (A). In such embodiments of the invention, the device pattern 12a in the high-density pattern region (A) may have islands having different widths. That is, in some embodiments of the invention, islands having different line widths may be iteratively formed in the high-density pattern region (A).

Figure 2B:
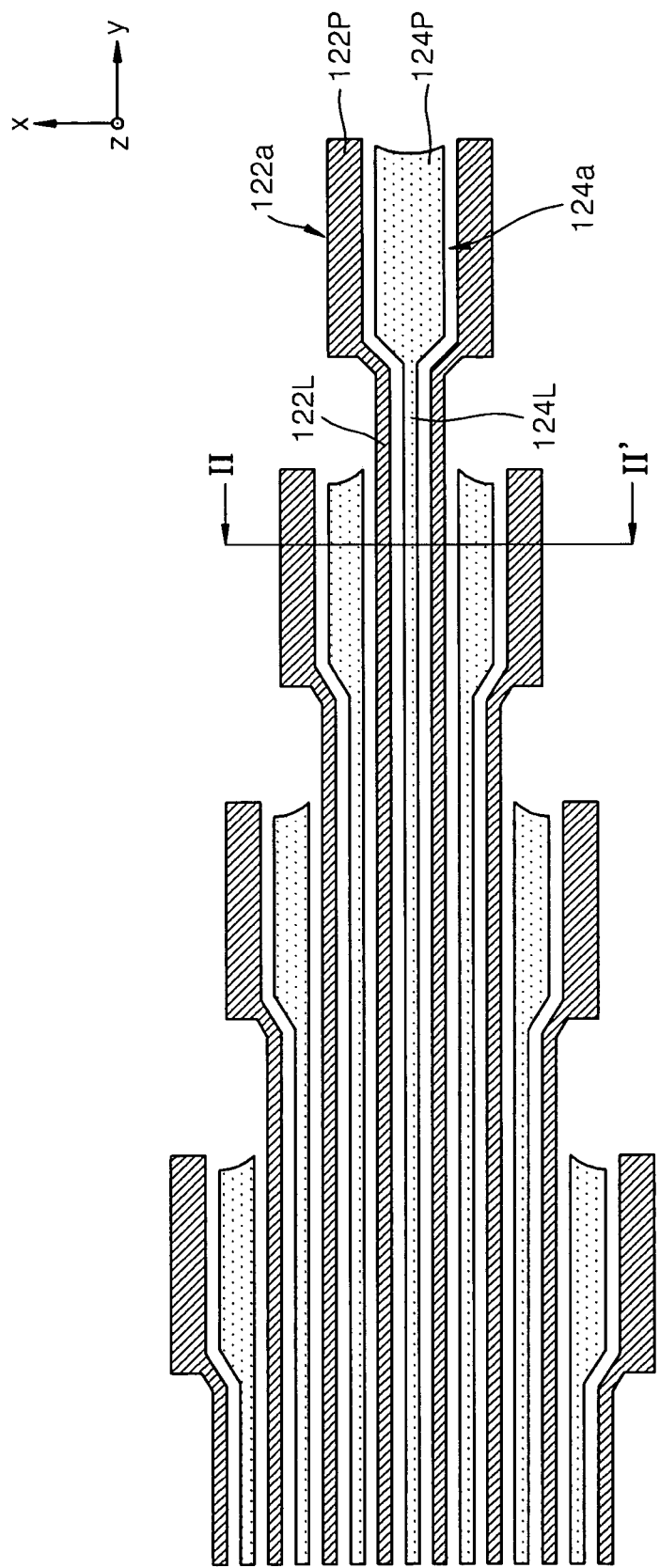
Figure 2C:
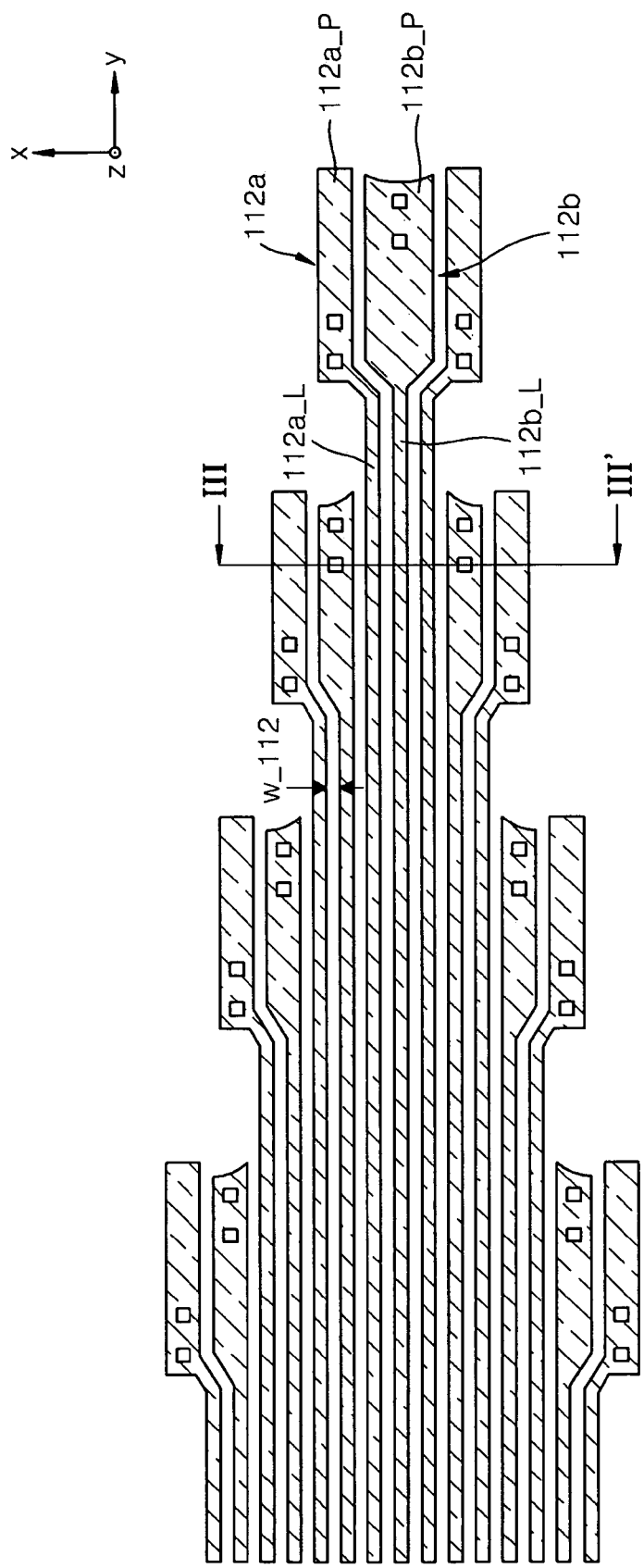

FIGS. 2A through 2C illustrate partial layout diagrams of layers formed during stages of an exemplary method of forming a pad pattern using a self-align double patterning method employing one or more aspects of the present invention, and FIG. 3A through 3F illustrate cross-sectional views of the resulting structures obtained during stages of the exemplary method of forming a pad pattern illustrated in FIGS. 2A through 2C.

Figure 3A:
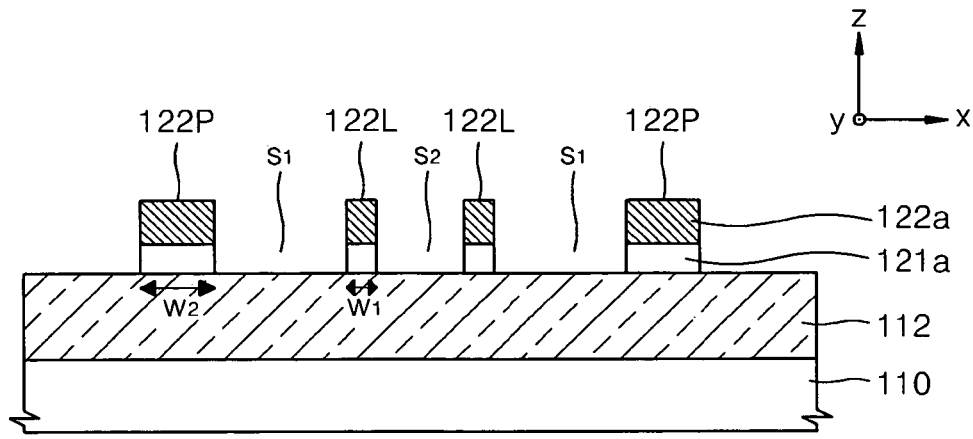
FIG. 3A through 3F illustrate cross-sectional views of the resulting structures obtained during stages of the exemplary method of forming a pad pattern illustrated in FIGS. 2A through 2C.

Specifically, FIG. 2A illustrates an exemplary partial layout diagram of an XY layer including the patterned first hard mask layer 122 corresponding to first hard mask patterns 122a. FIG. 2B illustrates an exemplary partial layout diagram of an XY layer including first and second hard mask layers 122, 124 corresponding to the first and second hard mask patterns 122a, 124a. FIG. 2C illustrates an exemplary partial layout diagram of an XY layer including a patterned conductive layer 112 corresponding to first and second pad patterns 112a, 112b, first and second lines 112a_L, 112b_L, and first and second pads 112a_P, 112b_P. FIG. 3A illustrates a cross-sectional view of a respective resulting structure taken along line I-I' of FIG. 2A. FIGS. 3D and 3E illustrate cross-sectional views of respective resulting structures taken along line II-II' of FIG. 2B, and FIG. 3F illustrates a cross-sectional view of a respective resulting structure taken along line III-III' of FIG. 2C.

In the exemplary embodiment of the pad pattern forming method illustrated in FIGS. 2A through 2C and 3A through 3F, the self-align double pattern method described in FIGS. 1A through 1G is employed to form a pad pattern. Thus, the exemplary embodiment of forming a pad pattern illustrated in FIGS. 2A through 2C and 3A through 3F may involve the exemplary method illustrated in FIGS. 1A through 1G, and in general, only differences between the two exemplary embodiments will be described below.

Referring to FIG. 3A, a conductive layer 112 may be formed on a semiconductor substrate 110 as an etch layer. When a target pattern is a gate pattern, the conductive layer 112 may be a doped polysilicon layer or may have a stacked structure with a doped polysilicon layer and a metal silicide layer. When the target pattern is a data pad pattern or a power pad pattern, the conductive layer 112 may be a metal layer such as a tungsten layer or an aluminum layer.

An auxiliary layer and a first hard mask layer may be sequentially formed on the conductive layer 112. A first photoresist pattern (not shown) may be formed on the first hard mask layer using a first photolithography process. The first hard mask layer and the auxiliary layer may be sequentially patterned using the first photoresist pattern as a mask in order to form a plurality of auxiliary patterns 121a and a plurality of first hard mask patterns 122a. Each of the auxiliary patterns 121a may be sequentially stacked on respective ones of the first hard mask patterns 122a. FIG. 2A illustrates an exemplary partial layout diagram of the patterned first hard mask layer, corresponding to the first hard mask patterns 122a.

The auxiliary pattern(s) 121a may be an oxide layer, and the first hard mask pattern(s) 122a may be formed of a polysilicon layer suitable for obtaining a vertical etch profile.

The auxiliary layer 121a may be formed such that the first hard mask patterns 122a may be formed on a same and/or substantially same XY plane as a second hard mask layer that may be formed later. In some embodiments, the auxiliary layer 121a may be omitted.

As illustrated in FIG. 2A, at least one of the first hard mask patterns 122a may include a first line mask pattern 122L having a first line width $W_1$ along the X direction, and a first pad mask pattern 122P. The first pad mask pattern 122P may extend from the first line mask pattern 122L, and may have a second line width $W_2$, along the X direction. A distance between one, some or all of the first pad mask patterns 122P, i.e., a width of a first space $S_1$ along the X direction, and the respective adjacent one(s) of the first line mask patterns 122L may be larger than a distance between one, some or all of adjacent ones of the first line patterns 122L of adjacent first hard mask patterns 122a, i.e., a width of a second space $S_2$ along the X direction. In some embodiments, a distance between one, some or all of adjacent ones of the first pad mask patterns 122P of the first hard mask patterns 122a, i.e., a width of a third space $S_3$ along the X direction, may be larger than that of the second space $S_2$ between adjacent ones of the first line patterns 122L of the first mask patterns 122a. In some embodiments, the first space $S_1$ may have the same width as the third space $S_3$ along the X direction.

Figure 3B:
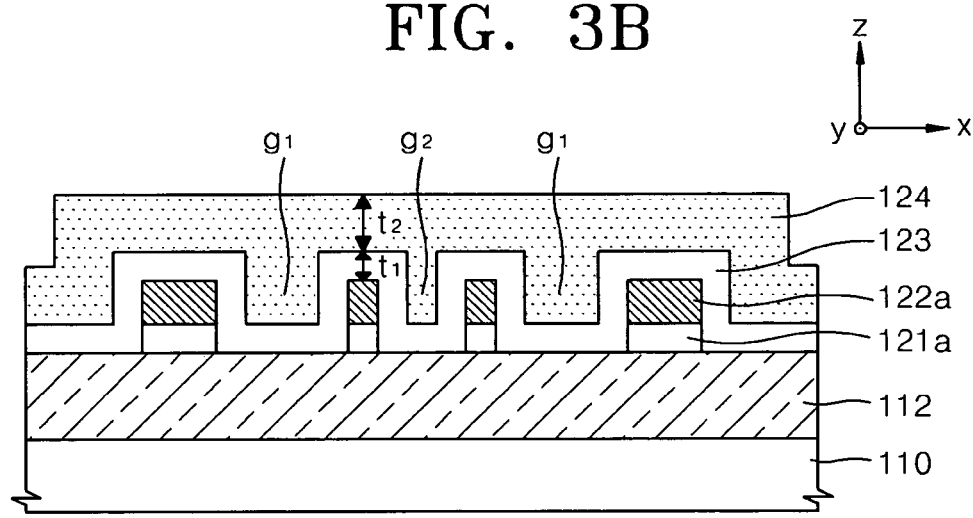

Referring to FIG. 3B, a sacrificial layer 123 may be formed on the substrate 110 including the first hard mask patterns 122a. As a result, gaps $g_1$ and $g_2$ may be formed on the sacrificial layer 123 between respective sidewalls of the first hard mask layer 122a.

The sacrificial layer 123 may be a conformal layer that has good step coverage characteristics, and is not affected by the density of a lower pattern. For example, the sacrificial layer 123 may be formed using an atomic layer deposition method.

The sacrificial layer 123 may have a thickness $t_1$ determined by a minimal space width, e.g., w_112 (refer to FIG. 2C), of target patterns, e.g., target patterns 112a and 12b (refer to FIG. 2C), to be formed. More particularly, in embodiments of the invention, the gaps $g_1$ and $g_2$ of the sacrificial layer 123 may be respectively determined based on widths, along the X direction, of pads 112a_P and 112b_P and widths, along the X direction, of lines 112a_L and 112b_L of the target patterns 112a and 112b (refer to FIG. 2C) to be formed.

A second hard mask layer 124 may be formed on the sacrificial layer 123. Like the first hard mask patterns 122a, the second hard mask layer 124 may be formed of a polysilicon layer suitable for obtaining a vertical etch profile. A thickness $t_2$ of the second hard mask layer 124 may be based on a size(s) of the gaps $g_1$ and $g_2$ of the sacrificial layer 123, e.g., the thickness $t_2$ of the second hard mask layer 124 may be sufficient for sufficiently filling the gaps $g_1$ and $g_2$ of the sacrificial layer 123.

Figure 3C:
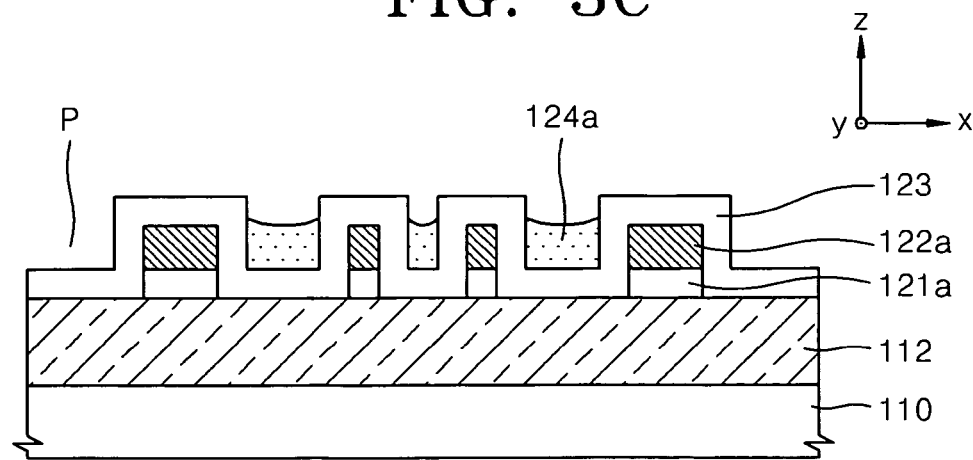
Figure 3D:
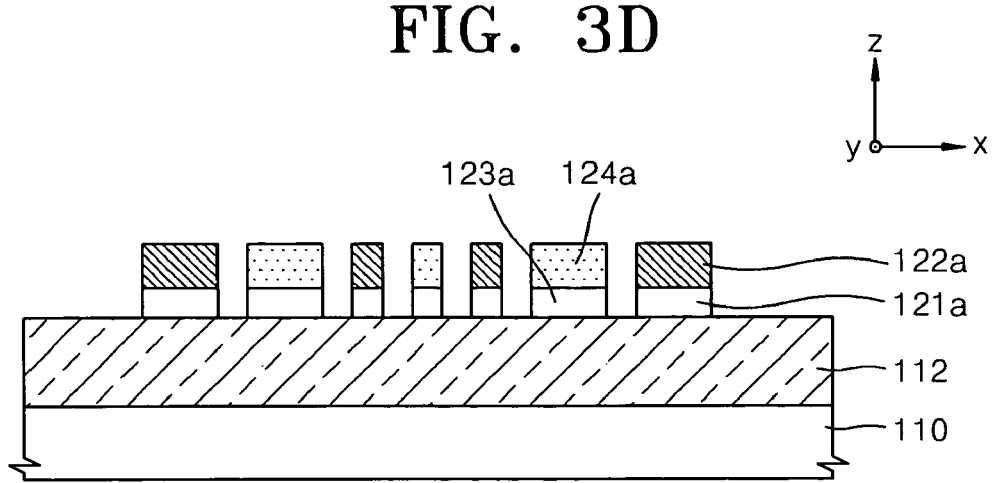
Figure 3E:
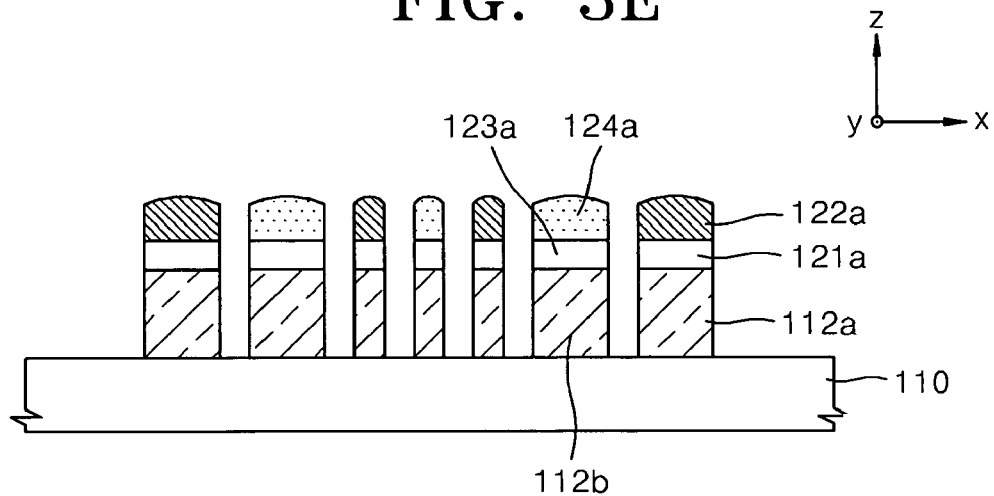
Figure 3F:
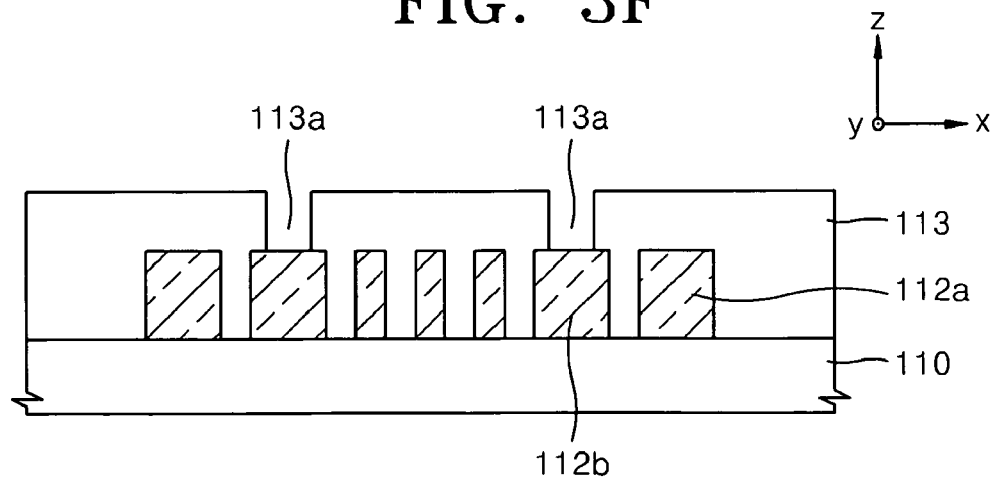

Referring to FIG. 3C, the second hard mask layer 124 may be partially removed by isotropic etching until at least the upper surface(s) of the sacrificial layer 123 overlapping the first hard mask pattern(s) 122a along the Y direction is exposed. As a result, the second hard mask layer 124 may remain in some spaces between respective portions of the sacrificial layer 123, e.g., the first to third spaces $S_1$, $S_2$, and $S_3$ as discussed above with regard to FIG. 1C, because the first to third spaces $S_1$, $S_2$, and $S_3$ directly between respective portions of the sacrificial layer 123 may have been completely filled when the second hard mask layer 124 was formed during prior processing. As a result, second hard mask patterns 124a may be formed, and the formed second hard mask patterns 124a may be substantially and/or completely aligned, e.g., parallel, with the first hard mask patterns 122a along the XY plane. In embodiments of the invention, top and/or bottom surfaces of the second hard mask patterns 124a may be formed on the same and/or substantially the same XY plane as top and/or bottom surfaces of the first hard mask patterns 122a, respectively.

Meanwhile, the second hard mask layer 124 may be completely removed from some of the spaces between respective portions of the sacrificial layer 123 that were not completely or substantially filled prior to the partial etching of the second hard mask layer 124. For example, as shown in FIG. 3C, the second hard mask layer 124 may be completely removed from outer sides P of an array of the first hard mask patterns 122a where spaces between respective portions of the sacrificial layer 123 were not substantially or completely filled prior to the partial etching of the second hard mask layer 124.

When the second hard mask layer 124 is formed of a polysilicon layer, the isotropic etching may be performed using, e.g., a mixed solution of $HNO_3$ and SC-1 (wet etching).

Referring to FIGS. 2B and 3D, the sacrificial layer 123 may be etched by an anisotropic etching method using the second hard mask pattern 124a as an etch mask, thereby exposing the first hard mask patterns 122a. In embodiments of the invention, the sacrificial layer 123 may be further etched by an anisotropic etching method using the second hard mask pattern 124a and the exposed first hard mask patterns 122a as etching masks until a respective portion(s) the conductive layer 112 is exposed. As a result, a sacrificial pattern(s) 123a may be formed under the respective second hard mask pattern 124a, and the respective portion of the conductive layer 112 between the first and second hard mask patterns 122a and 124a may be exposed.

Referring to FIG. 2B, the second hard mask pattern 124a may include a second pad mask pattern 124P and a second line mask pattern 124L. The second pad mask pattern 124P may be formed, e.g., between one of the first line mask pattern(s) 122L and an adjacent one of the first pad mask patterns 122P, i.e., in the first space $S_1$ shown in FIG. 2A, or between respective adjacent ones of the first pad mask patterns 122P of the first hard mask patterns 122a, i.e., in the third space $S_3$ shown in FIG. 2A. The second line mask pattern 124L may be formed between respective adjacent ones of the first line mask patterns 122L of the first hard mask patterns 122a.

Referring to FIG. 3E, the exposed portion(s) of the conductive layer 112 may be patterned by, e.g., an anisotropic etching method using the first and second hard mask patterns 122a and 124a as etch masks, thereby forming first and second pad patterns 112a and 112b.

Referring to FIGS. 2C and 3F, the first and second hard mask patterns 122a and 124a, and the auxiliary patterns 121a and the sacrificial patterns 123a may be removed, thereby exposing the first and second pad patterns 112a and 112b. More particularly, e.g., the first pad patterns 112a may be formed using the first hard mask patterns 122a as a mask, and the second pad patterns 112b may be formed using the second hard mask patterns 124a as a mask.

Referring to FIG. 2C, the respective first pad pattern 112a may include a first line 112a_L extending along a predetermined direction and a first pad 112a_P extending from the first line 112a_L. The respective second pad pattern 112b may include a second line 112b_L extending in a predetermined direction and a second pad 112b_P extending from the second line 112b_L. One, some or all of the second pad patterns 112b may be formed between respective adjacent ones of the first pad patterns 112a. The second line 112b_L may be formed between respective adjacent ones of the first lines 112a_L, and the second pad 112b_P may be formed between respective adjacent ones of the first pads 112a_P or between the first pad 112a_P and the respective adjacent one of the first lines 112a_L. In such embodiments, because the space width W_112 between the first pad pattern 112a and the second pad pattern 112b may be determined by the thickness $t_1$ of the sacrificial layer 123, the space width W_112 may be substantially and/or completely uniform among all the pad patterns 112a and 112b.

Referring to FIG. 3C, an insulation layer 113 may be formed on the pad patterns 112a and 112b, and contact holes 113a may be formed in the insulation layer 113 to expose the pad patterns 112a and 112b.

As explained above, in embodiments of the invention, pad patterns may be formed using the exemplary embodiment of the self-align double patterning method illustrated in FIGS. 1A through 1G. Therefore, embodiments of the present invention enable a pad pattern and a gate pattern and/or a signal line pattern to be simultaneously and/or substantially simultaneously formed in a pad region, and another region(s), respectively, using the self-align double patterning process illustrated in FIGS. 1A through 1G.

Figure 4A:
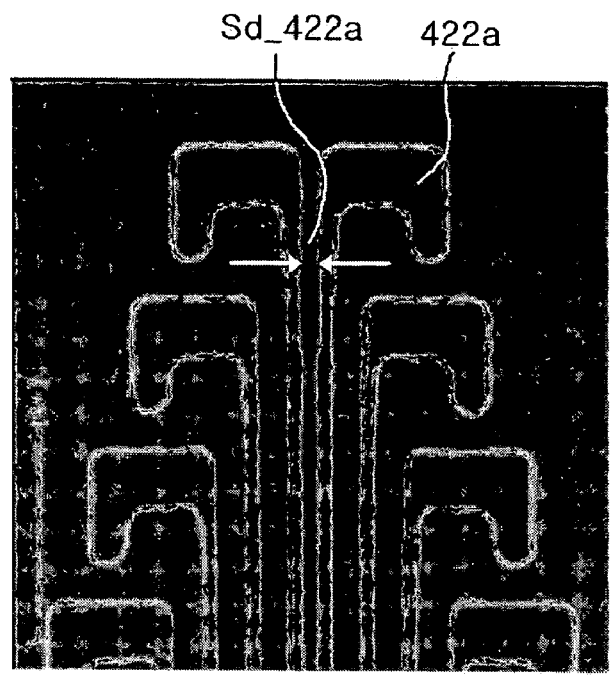
FIGS. 4A and 4B illustrate scanning electron microscope (SEM) images of pad patterns according to another exemplary embodiment of the present invention.
Figure 4B:
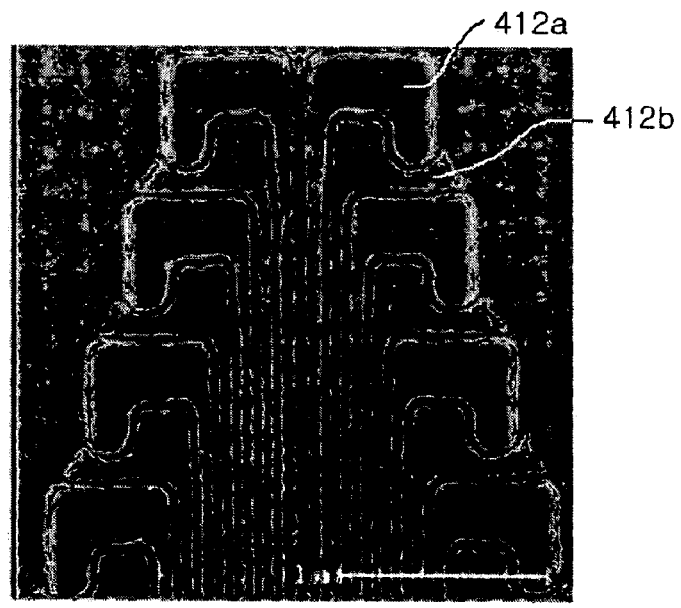

FIGS. 4A and 4B illustrate scanning electron microscope (SEM) images illustrating pad patterns according to another embodiment of the present invention.

Referring to FIG. 4A, first hard mask patterns 422a may be formed using the method illustrated in FIG. 3A. In the first hard mask patterns 422a, a space width Sd_422a between central patterns may be smaller than other space widths.

Referring to FIG. 4B, first pad patterns 412a and second pad patterns 412b may be formed using the exemplary method illustrated in FIGS. 3B through 3E. The first pad pattern 412a may be formed using the first hard mask patterns 422a of FIG. 4A as a mask, and the second pad pattern 412b may be formed using a second hard mask pattern (not shown) formed using a self-align patterning process employing the first hard mask patterns 422a. In such embodiments, no second pad pattern 412b is formed between central patterns of the first pad patterns 412a because the space width Sd_422a of the first hard mask patterns 422a is narrower than other space widths of the first hard mask patterns 422a. In this way, a gate pad having even number pad patterns may be formed.

FIGS. 5A through 5F illustrate plan views of resulting structures obtained during an exemplary method of forming a contact hole pattern using a self-align double patterning method according to an embodiment of the present invention, and FIGS. 6A through 6F respectively illustrate cross-sectional views of resulting structures taken along each of lines IIa-IIa' and IIb-IIb' of FIGS. 5A through 5F. More particularly, region (A) of each of FIGS. 6A through 6F corresponds to cross sectional views of the resulting structures taken along line IIa-IIa' of FIGS. 5A through 5F, respectively, and region (B) of each of FIGS. 6A through 6F corresponds to cross sectional views of the resulting structures taken along line IIb-IIb' of FIGS. 5A through 5F, respectively.

In the exemplary embodiment of a contact hole pattern forming method illustrated in FIGS. 5A through 5F and 6A through 6F, the self-align double pattern method described in FIGS. 1A through 1G is applied to forming a contact hole pattern. Thus, the exemplary embodiment of forming a contact hole pattern illustrated in FIGS. 5A through 5F and 6A through 6F may involve the exemplary method illustrated in FIGS. 1A through 1G, and in general, only differences between the two exemplary embodiments will be described below.

Figure 5B:
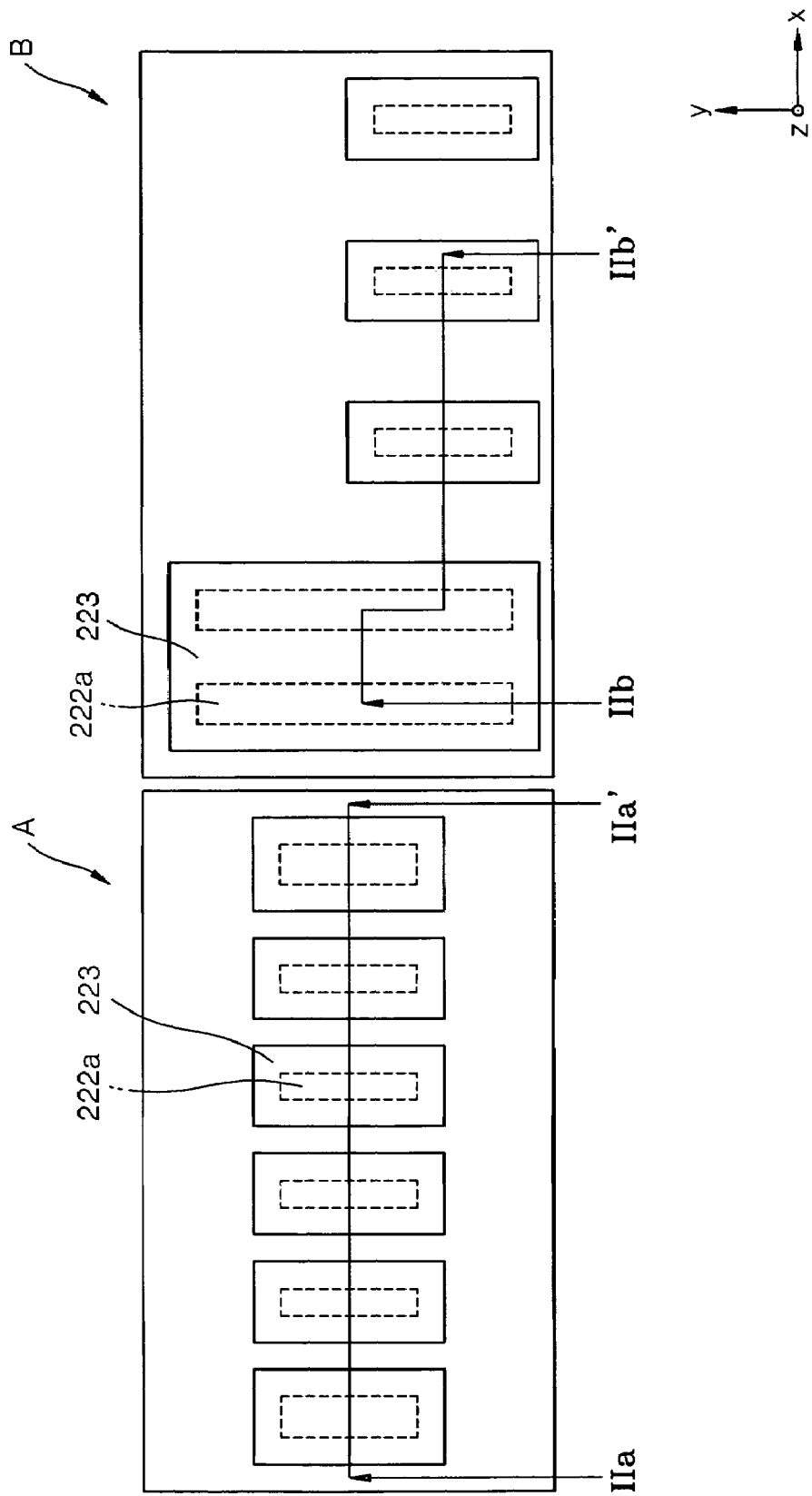
Figure 6A:
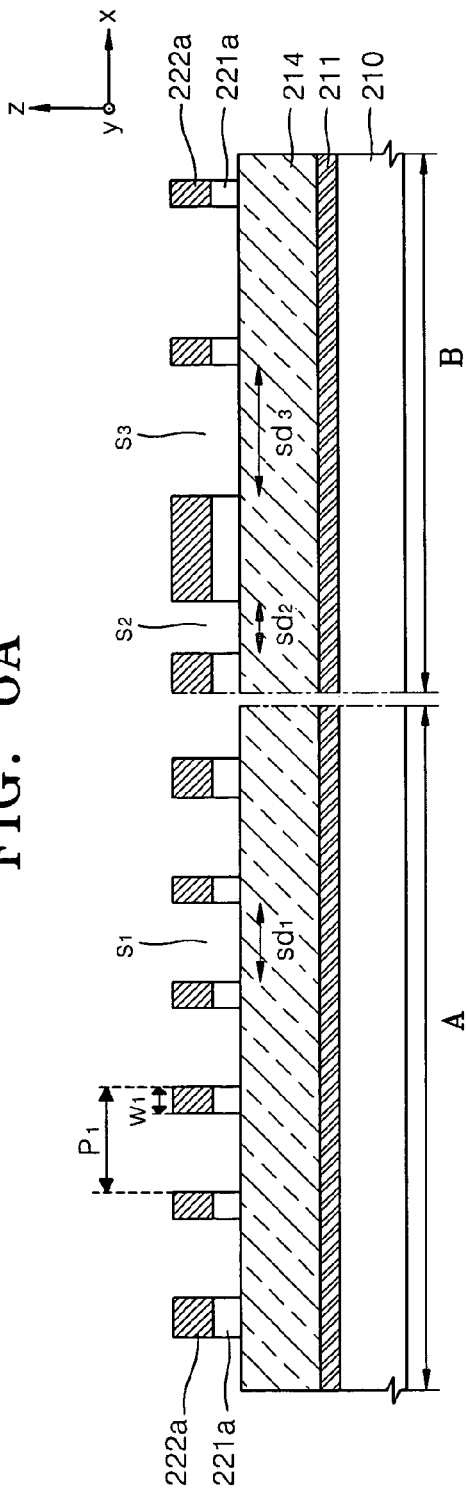

Referring to FIGS. 5A and 6A, a semiconductor substrate 210 with a high-density pattern region (A) and a low-density pattern region (B) may be provided. In the high-density pattern region (A), patterns having a same width may be repeatedly formed. A remaining or other region of the substrate 210 may be referred to as the low-density pattern region (B).

An etch layer 214 may be formed on the substrate 210. The etch layer 214 may be an insulation layer formed of, e.g., an oxide layer or a nitride layer. An etch stop layer 211 may be formed on the substrate 210 before the etch layer 214 is formed. The etch stop layer 211 may have an etch selectivity relative to the etch layer 214 and the substrate 210. When the etch layer 214 is etched, the etch stop layer 211 may function as an etching end point.

An auxiliary layer (not shown) and a first hard mask layer (not shown) may be sequentially formed on the etch layer 214. A first photoresist pattern (not shown) may be formed on the first hard mask layer using, e.g., a first photolithography process. The first hard mask layer and the auxiliary layer may be sequentially patterned using the first photoresist pattern as a mask, thereby forming a plurality of auxiliary patterns 221a and a plurality of first hard mask patterns 222a. Each of the first hard mask patterns 22a may be stacked on a respective one of the auxiliary patterns 221a.

The auxiliary layer may be formed of, e.g., an oxide layer, and the first hard mask layer may be formed of, e.g., a polysilicon layer suitable for obtaining a vertical etch profile.

The auxiliary pattern 221a may be formed such that the first hard mask patterns 222a may be formed on a same and/or substantially same XY plane as a second hard mask layer to be formed. In some embodiments, the auxiliary pattern 221a may be omitted.

The first hard mask patterns 222a may be island type patterns, and may be formed between adjacent target contact hole patterns 214a, 214b, and 214c. The target contact hole patterns 214a, 214b, and 214c may be formed using the method described herein with reference to FIGS. 5A through 5F and 6A through 6F, thereby resulting in the target contact hole patterns 214a, 214b and 214c shown in FIG. 5F.

As shown in FIG. 5A, in embodiments of the invention, the first hard mask patterns 222a may be formed in odd- or even-numbered gaps between holes of the target contact hole patterns 214a in the high-density pattern region (A), and may be formed in all gaps between holes of the target contact hole patterns 214b and 214c in the low-density pattern region (B). The first hard mask patterns 222a may have a minimal pitch $P_1$ in the high-density pattern region (A). The minimal pitch $P_1$ may correspond to a resolution limit of the photolithography process. In the exemplary embodiment illustrated in FIGS. 5A through 5F and 6A through 6F, in the high-density pattern region (A), the pitch $P_1$ of the first hard mask patterns 222a may be four times the width $W_1$ of the first hard mask patterns 222a ($P_1=4W_1$). In the high-density pattern region (A), one or more first spaces $S_1$ with a first space width $sd_1$ may be defined between adjacent ones of the first hard mask patterns 222a, and in the low-density pattern region (B), second and third spaces $S_2$ and $S_3$ with second and third space widths $sd_2$ and $sd_3$ may be defined between adjacent ones of the first hard mask patterns 222a. The second space width $sd_2$ may be smaller than the first space width $sd_1$, and the third space width $sd_3$ may be larger than the first space width $sd_1$.

Figure 6B:
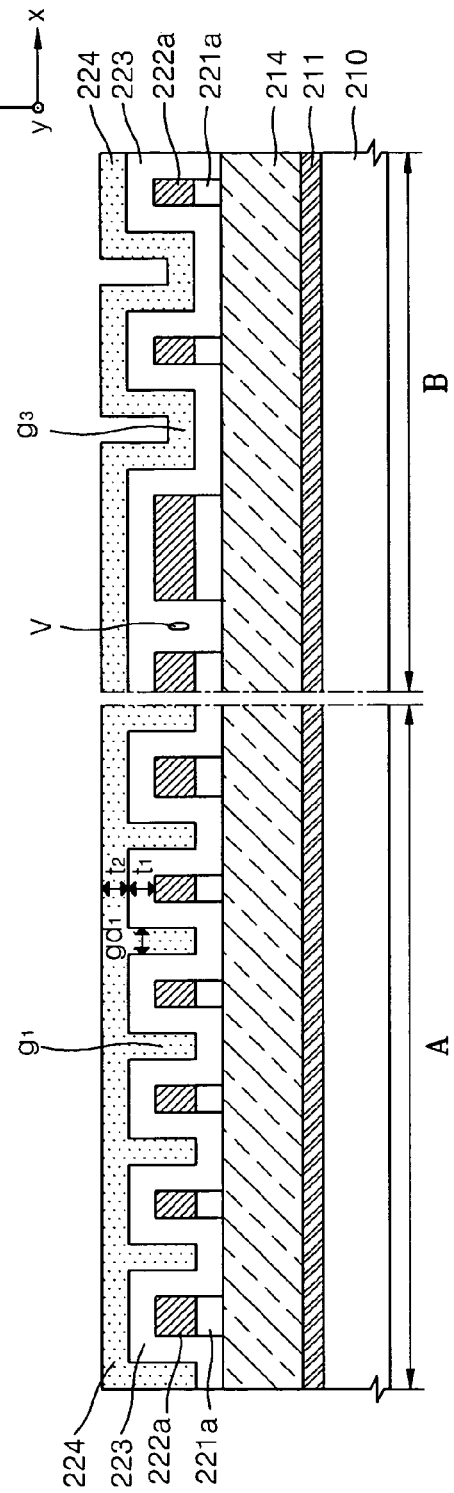

Referring to FIGS. 5B and 6B, a sacrificial layer 223 may be formed on the substrate 210 including the first hard mask patterns 222a. The sacrificial layer 223 may be a conformal layer that has good step coverage characteristics and is not affected by the density of a lower pattern. For example, the sacrificial layer 223 may be an oxide layer formed by an atomic layer deposition method.

In the high-density pattern region (A), the sacrificial layer 223 may have a thickness $t_1$ determined by a width Wx_214a (refer to FIG. 5A), along the X direction, of the contact hole of the target contact hole pattern 214a to be formed. Further, in the high-density pattern region (A), gaps $g_1$ with a gap width $gd_1$ may be formed on the sacrificial layer 223 between facing sidewalls of the first hard mask patterns 222a. The gap width $gd_1$, i.e., the distance between respective facing surfaces of the sacrificial layer 223, may be equal to a width $W_1$ (see FIG. 6A), along the X direction, of the first hard mask patterns 222a in the high-density pattern region (A).

Meanwhile, when the sacrificial layer 223 has a uniform and/or substantially uniform thickness $t_1$ on top surfaces and sidewalls of the first hard mask patterns 222a, the second space width $sd_2$ between respective facing sidewalls of the first hard mask patterns 222a in the low-density pattern region (B) may be equal to or smaller than twice the thickness $t_1$ of the sacrificial layer 223 ($sd_2<2t_1$). In such cases, as illustrated in FIG. 6B, a gap may not be formed on a portion of the sacrificial layer 223 located in the second space $S_2$ between the respective facing sidewalls of the first hard mask patterns 222a. Instead, a void (V) may be formed in the portion of the sacrificial layer 223 located in the second space $S_2$. However, in the third space $S_3$, a gap $g_3$ may be formed.

A second hard mask layer 224 may be formed on the sacrificial layer 223. The second hard mask layer 224 may be formed of a material having etching characteristics similar to and/or the same as those of the first hard mask layer. For example, like the first hard mask layer, the second hard mask layer 224 may be formed of a polysilicon layer suitable for obtaining a vertical etch profile.

The second hard mask layer 224 may have a thickness $t_2$ sufficient for filling the gaps $g_1$ on the sacrificial layer 223 in the high-density pattern region (A). In such cases, the gaps $g_1$ of the sacrificial layer 223 formed in the first spaces $S_1$ may be completely and/or substantially completely filled with the second hard mask layer 224, and the second hard mask layer 224 may not fill the second space $S_2$ if no gap was present in the second space $S_2$. Meanwhile, in the third space $S_3$, the second hard mask layer 224 may be formed along the sacrificial layer 223. More particularly, e.g., in embodiments in which the sacrificial layer 223 and the second hard mask layer 224 each have a substantially uniform thickness t1, t2, respectively, along both the XY plane parallel to the substrate 210 and the sidewalls of the first hard mask patterns 222a defining the third space S3, the third space width $sd_3$ may be larger than or equal to twice the sum of the thickness t1 of the sacrificial layer 223 and the thickness t2 of the second hard mask layer 224 ($sd_3>2(t1+t2)$).

Referring to FIGS. 5C and 6C, the second hard mask layer 224 may be partially removed by isotropic etching until the sacrificial layer 223 on at least an upper surface(s) of the first hard mask pattern 222a is exposed. In such embodiments, the second hard mask layer 224 may be completely removed from the third space $S_3$ because the third space $S_3$ between respective ones of the first hard mask patterns 222a may not have been completely or substantially filled in as a result of prior processing, whereas the second hard mask layer 224 may remain in the first spaces $S_1$ because the first spaces $S_1$ between respective ones of the first hard mask patterns 222a may have been completely and/or substantially completely filled in as a result of prior processing. As a result, second hard mask patterns 224a may be formed, and the formed second hard mask patterns 224a may be substantially and/or completely aligned, e.g., parallel, with the first hard mask patterns 222a along the XY plane. In embodiments of the invention, top and/or bottom surfaces of the second hard mask patterns 224a may be formed on the same and/or substantially the same XY plane as top and/or bottom surfaces of the first hard mask patterns 222a, respectively.

When the second hard mask layer 224 is a polysilicon layer, the isotropic etching may be performed using, e.g., a mixed solution of $HNO_3$ and SC-1 (wet etching).

Figure 5D:
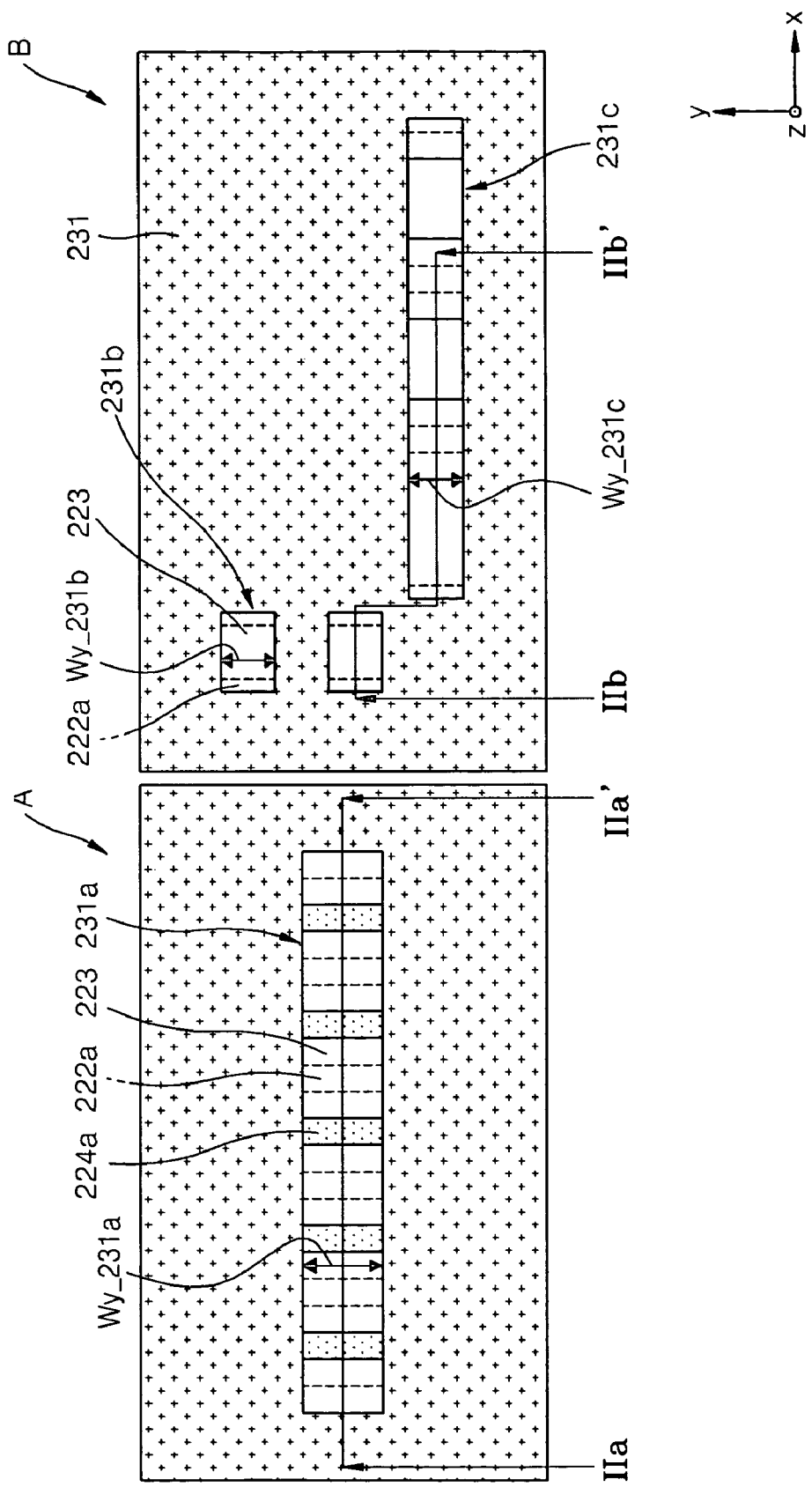

Referring to FIGS. 5D and 6D, a photoresist pattern 231 may be formed on the sacrificial layer 223 and the second hard mask pattern 224a using a second photolithography process. In the high-density pattern region (A), the photoresist pattern 231 may include a slit 231a extending along the X direction, i.e., crossing the second hard mask patterns 222a. More particularly, e.g., the slit 231a may cross a plurality of the second hard mask patterns 222a adjacent to each other. That is, a portion of the respective second hard mask pattern(s) 222a and the sacrificial layer 223 adjoining the respective second hard mask patterns 222a may be exposed by the slit 231a. The slit 231a may have a width Wy_231a, along the Y direction, corresponding to a width Wy_214a (refer to FIG. 5A), along the Y direction, of the target contact hole pattern 214a to be formed in the high-density pattern region (A). Therefore, the width Wx_214a of the target contact hole pattern 214a may be determined by the thickness $t_1$ of the sacrificial layer 223 as described above, and the width Wy_214a of the target contact hole pattern 214a may be determined by the width Wy_231a of the slit 231a.

Meanwhile, the photoresist pattern 231 may further include openings 231b and 231c exposing portions of the sacrificial layer 223 formed in the second and third spaces $S_2$ and $S_3$ between the first hard mask patterns 222a in the low-density pattern region (B). More particularly, widths Wy_231b and Wy_231c of the openings 231b and 231c, along the Y direction, may correspond to widths Wy_214b and Wy_214c, along the Y direction, of the target contact hole patterns 214b and 214c (refer to FIG. 5A) to be formed in the low-density pattern region (B).

Figure 6E:
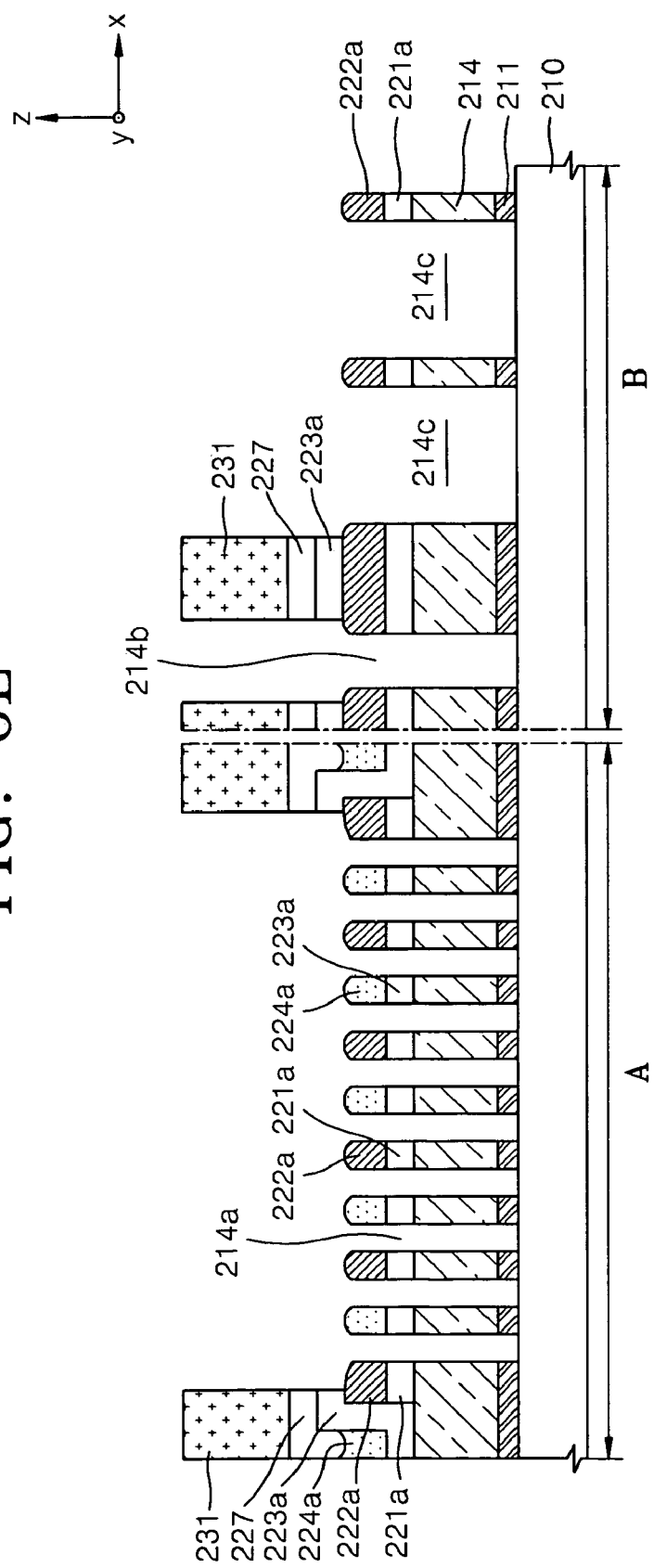

When a plurality of contact hole patterns 214c (refer to FIG. 5A) are arranged adjacent to each other along the X direction, the opening 231c may overlap some or all of the contact hole patterns 214c (refer to FIG. 5A and 6E).

In embodiments of the invention, a pattern pitch formed in the second photolithography process may be larger than that formed in the first photolithography process for the first hard mask patterns 222a.

As shown in FIG. 6D, a planarization film layer 227 may be formed over the substrate 210 before the photoresist pattern 231 is formed. The planarization film 227 may increase a depth of focus (DOF) in the second photolithography process. The planarization film 227 may be formed of an insulation film having good planarization characteristics, such as a spin on glass (SOG) film or a flowable oxide (FOX) film.

Figure 5E:
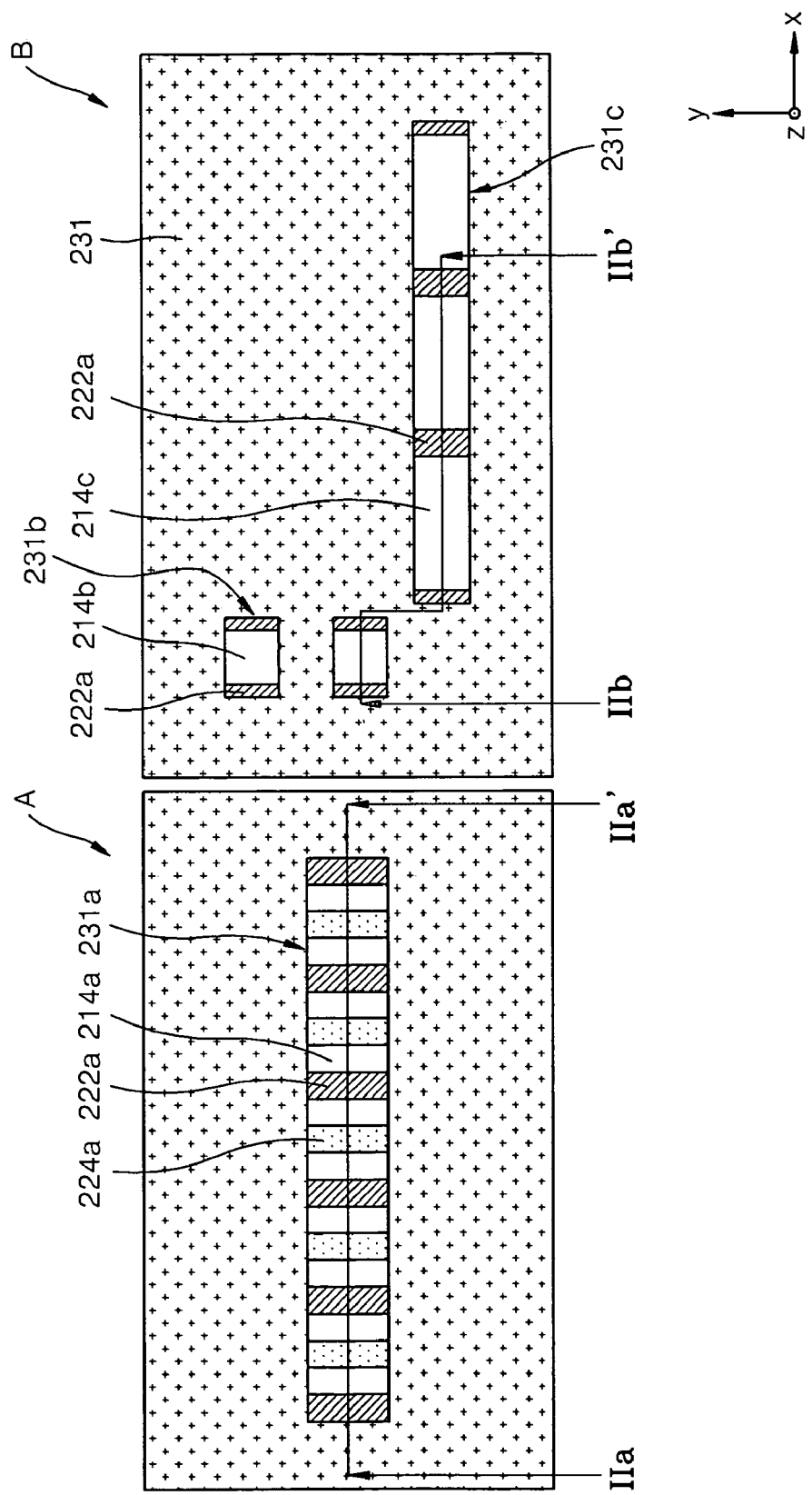

Referring to FIGS. 5E and 6E, the planarization film 227 may be etched using the photoresist 231 as a mask to expose the second hard mask pattern(s) 224a and the sacrificial layer 223 adjacent to the second hard mask pattern 224a, and the sacrificial layer 223 may be anisotropically etched using the photoresist pattern 231 and the second hard mask pattern 224a as etch masks to expose the first hard mask pattern(s) 222a. In embodiments of the invention, the sacrificial layer 223 may be further anisotropically etched using the photoresist pattern 231, the second hard mask pattern 224a, and the first hard mask patterns 222a as etch masks in order to expose a respective portion(s) the etch layer 214. As a result, in the high-density pattern region (A), a sacrificial pattern 223a stacked under the second hard mask pattern 224a between the first hard mask patterns 222a may be formed, and the respective portion(s) of the etch layer 214 between respective adjacent ones of the first and second hard mask patterns 222a and 224a may be exposed.

Meanwhile, in the low-density pattern region (B), respective portion(s) of the etch layer 214 may be exposed between adjacent ones of the first hard mask patterns 222a. Thus, in embodiments of the invention, the second hard mask patterns 224a may not be formed, e.g., portions of the second hard mask layer 224 may be completely etched, in the low-density pattern region (B) by adjusting, e.g., the second and third space widths $sd_2$ and $sd_3$ between the first hard mask patterns 222a.

The exposed etch layer 214 and the etch stop layer 211 may then be anisotropically etched using the first and second hard mask patterns 222a and 224a as etch masks, thereby forming the contact hole patterns 214a, 214b, and 214c.

Figure 6F:
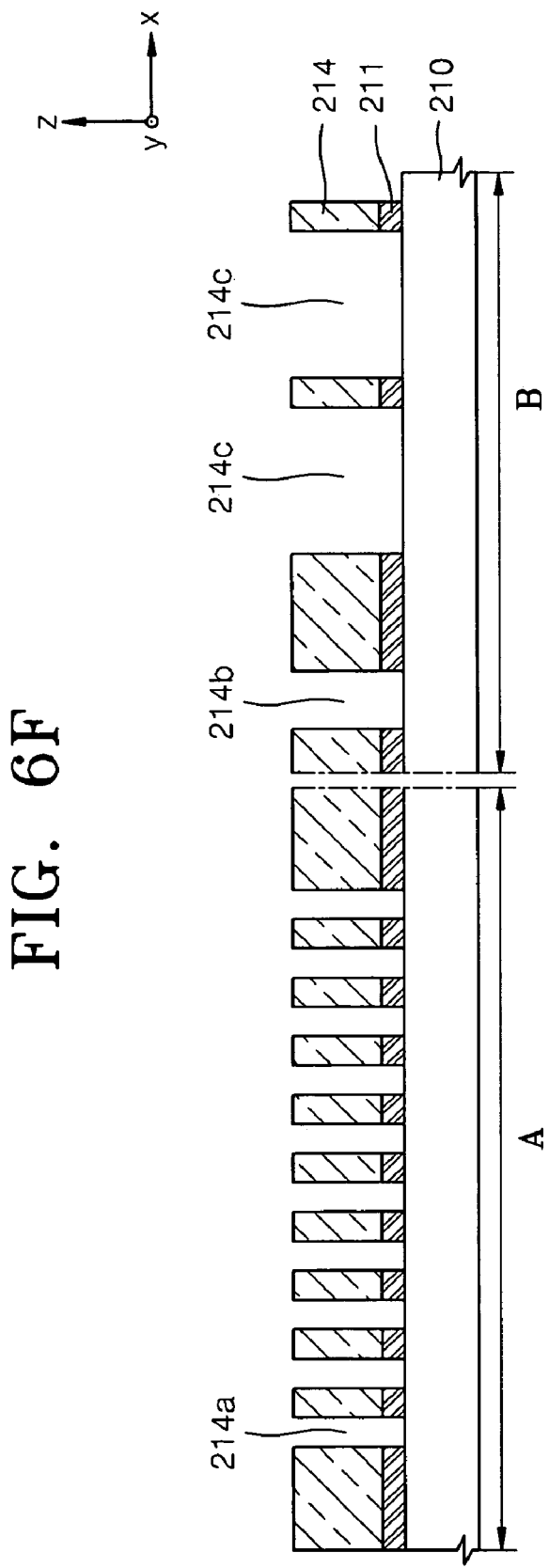

Referring to FIGS. 5F and 6F, the photoresist pattern 231, the planarization film 227, the second hard mask patterns 224a, the sacrificial patterns 223a respectively under the second hard mask patterns 224a, the first hard mask patterns 222a, and the auxiliary patterns 221a may then be removed. As a result, a top surface(s) of the etch layer 214, e.g., insulation layer, including the contact hole patterns 214a, 214b, and 214c may be exposed.

As explained above, after the first hard mask pattern(s) 222a are formed by the first photolithography process, the second hard mask pattern 224a may be formed in alignment with the first hard mask patterns 222a.

After that, the photoresist pattern 231 may be formed by the second photolithography process to determine the widths Wy_214a, Wy_214b, and Wy_214c of the contact hole patterns 214a, 214b, and 214c to be formed, and the etch layer 214 may be patterned using the photoresist pattern 231, the first hard mask patterns 222a, and the second hard mask pattern 224a as etch masks. Thus, in embodiments of the invention, contact hole pattern(s) 214a having a fine pitch may be formed in the high-density pattern region (A) at a resolution lower than the resolution limit of a photolithography process.

Meanwhile, in the low-density pattern region (B), the second hard mask pattern 224a may not be formed by adjusting, e.g., the space widths $sd_2$ and $sd_3$ of the first hard mask layer 222a, and the photoresist pattern 231 may be formed to determine the widths Wy_214b and Wy_214c of the contact hole patterns 214b and 214c to be formed. Then, in the low-density pattern region (B), the etch layer 214 may be patterned using the photoresist pattern 231 and the first hard mask patterns 222a as etch masks to form the contact hole patterns 214b and 214c. Therefore, the contact hole patterns 214b and 214c formed in the low-density pattern region (B) may have various widths and pitches. Alternatively, in embodiments of the invention, the contact hole patterns 214b and 214c may be formed in the low-density pattern region (B) using only the second photolithography process.

FIGS. 7A through 7G illustrate plan views of resulting structures obtained during another exemplary method of forming a contact hole pattern using a self-align double patterning method according to one or more aspects of the present invention, and FIGS. 8A through 8G respectively illustrate cross-sectional views of the resulting structures taken along each of lines IIIa-IIIa' and IIIb-IIIb' of FIGS. 7A through 7G. More particularly, region (A) of each of FIGS. 8A through 8G corresponds to cross sectional views of the resulting structures taken along line IIa-IIa' of FIGS. 7A through 7G, respectively, and region (B) of each of FIGS. 8A through 8G corresponds to cross sectional views of the resulting structures taken along line IIb-IIb' of FIGS. 7A through 7G, respectively.

In the contact hole pattern forming method illustrated in FIGS. 7A through 7G and 8A through 8G, the self-align double pattern method described in FIGS. 1A through 1G is applied to forming a contact hole pattern. Thus, the exemplary embodiment of forming a contact hole pattern illustrated in FIGS. 7A through 7G and 8A through 8G may involve the exemplary method illustrated in FIGS. 1A through 1G, and in general, only differences between the two exemplary embodiments will be described below.

Figure 7B:
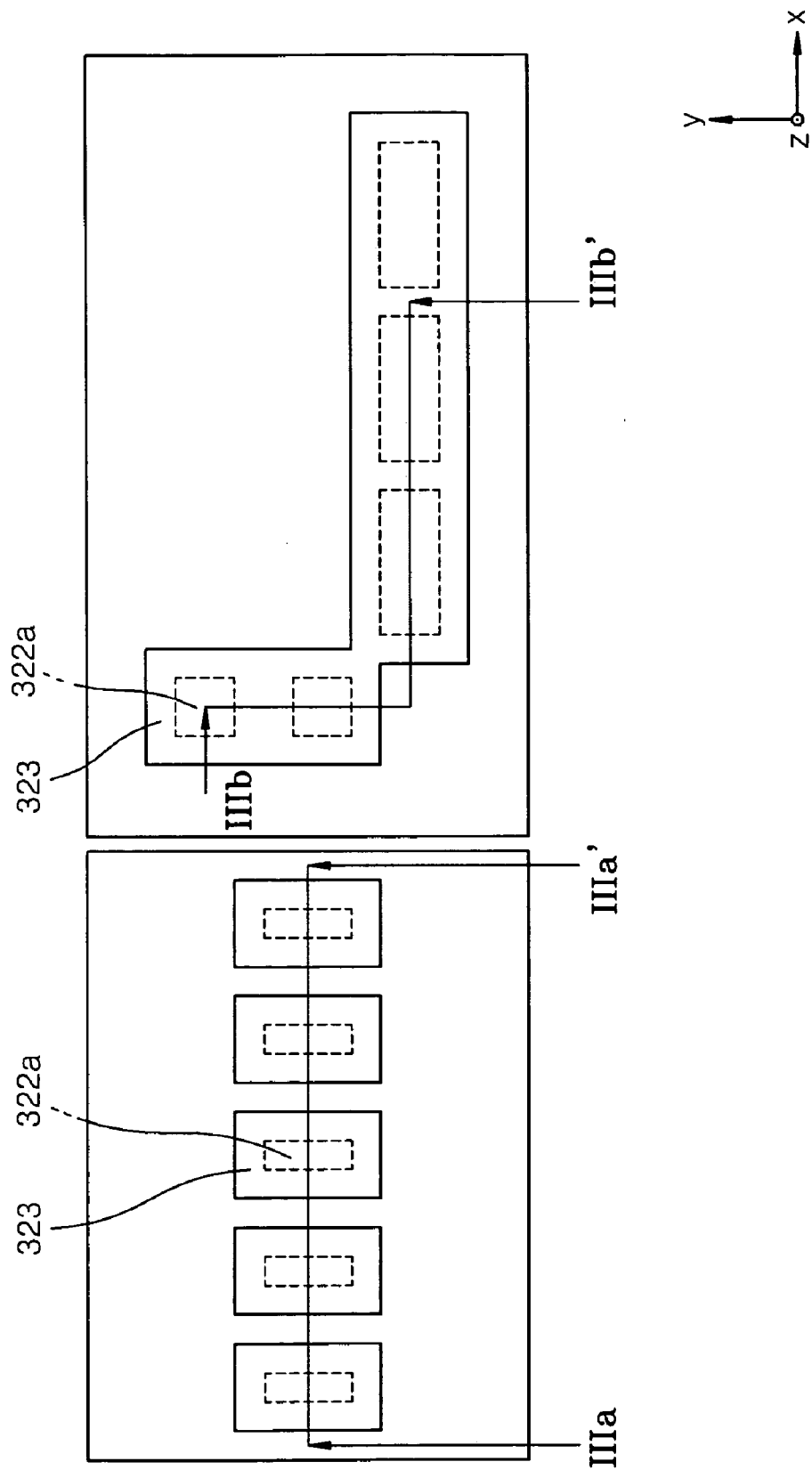
Figure 8A:
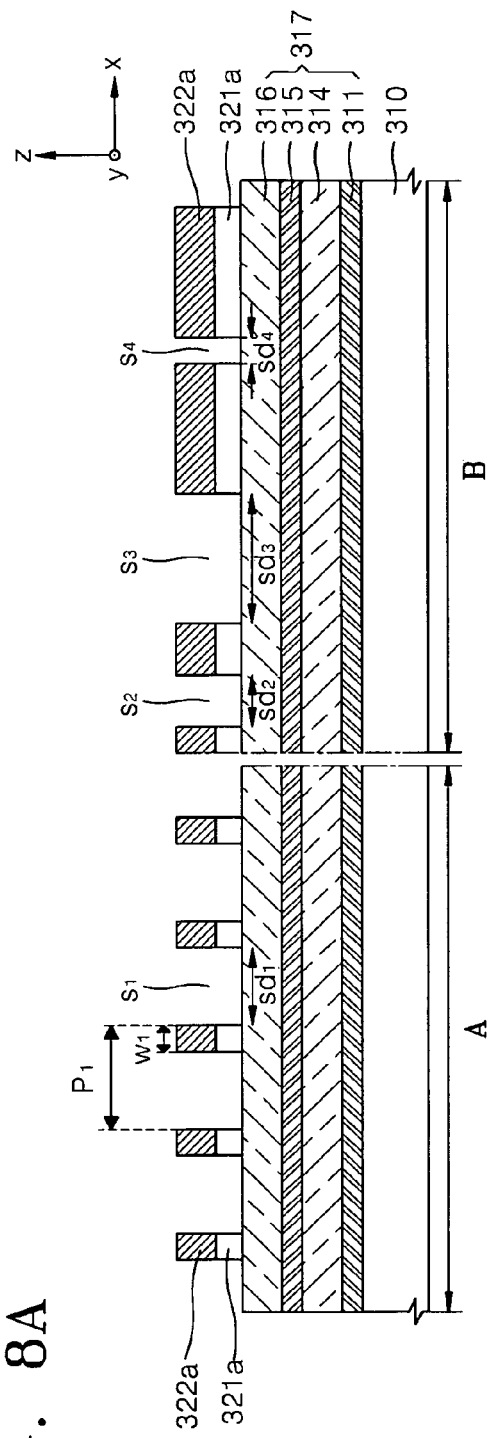

Referring to FIGS. 7A and 8A, a semiconductor substrate 310 with a high-density pattern region (A) and a low-density pattern region (B) may be provided. In the high-density pattern region (A), patterns having a same or substantially same width may be repeatedly formed. A remaining or other region of the semiconductor substrate 310 may be referred to as the low-density pattern region (B).

A first etch stop layer 311, a first etch layer 314, a second etch stop layer 315, and a second etch layer 316 may be sequentially formed on the semiconductor substrate 310. The etch layers 314 and 316 and the etch stop layers 311 and 315 may be insulation layers 317. For example, the etch layers 314 and 316 may be oxide layers or nitride layers, and the etch stop layers 311 and 315 may have predetermined etch selectivity with respect to the etch layers 314 and 316 so as to function as etching end points. The etch stop layers 311 and 315 may be formed of a same material.

In some embodiments, the first etch stop layer 311 and/or the second etch stop layer 315 may be omitted. When the second etch stop layer 315 is omitted, a single layer may be formed instead of the first and second etch layers 314 and 316.

An auxiliary layer (not shown) and a first hard mask layer (not shown) may be sequentially formed on the second etch layer 316. A first photoresist pattern (not shown) may be formed on the first hard mask layer using a first photolithography process. The first hard mask layer and the auxiliary layer may be sequentially patterned using the first photoresist pattern as a mask, thereby forming a plurality of auxiliary patterns 321a and a plurality of first hard mask patterns 322a. Each of the first hard mask patterns 322a may be stacked on a respective one of the auxiliary patterns 321a.

The auxiliary layer may be formed of an oxide layer, and the first hard mask layer may be formed of a polysilicon layer suitable for obtaining a vertical etch profile. The auxiliary pattern(s) 321a may be formed such that the first hard mask patterns 322a can be formed on the same XY plane as a second hard mask layer to be formed. In some cases, the auxiliary pattern 321a may be omitted.

The first hard mask patterns 322a may be island type patterns. In the high-density pattern region (A), the first hard mask patterns 322a may be formed corresponding to a target contact hole pattern(s) 314a to be formed in the high-density pattern region (A). The target contact hole patterns 314a may be formed using the exemplary method illustrated in FIGS. 7A through 7G and 8A through 8G. More particularly, the first hard mask patterns 322a may be formed to respectively correspond with odd- or even-numbered target contact hole patterns 314a in the high-density pattern region (A). Meanwhile, in the low-density region (B), adjacent ones of the first hard mask patterns 322a may respectively correspond to each of the target contact hole patterns 314b and 314c (refer to FIG. 7F) to be formed. Therefore, in the low-density pattern region (B), all the widths of the target contact hole patterns 314b and 314c may be determined with only the first hard mask patterns 322a.

The first hard mask patterns 322a may be formed with a minimal pitch $P_1$ in the high-density pattern region (A). The minimal pitch $P_1$ may correspond to a resolution limit of the photolithography process. In the exemplary embodiment illustrated in FIGS. 7A through 7G and 8A through 8g, in the high-density pattern region (A), the pitch $P_1$ of the first hard mask patterns 322a may be four times the width $W_1$ of the first hard mask patterns 322a ($P_1=4W_1$). Meanwhile, first spaces $S_1$ with a first space width $sd_1$ may be formed between adjacent ones of the first hard mask patterns 322a in the high-density pattern region (A), and second to fourth spaces $S_2$, $S_3$, and $S_4$ with second to fourth space widths $sd_2$, $sd_3$, and $sd_4$ may be formed between respective ones of the first hard mask patterns 322a in the low-density pattern region (B). The third space width $sd_3$ may be larger than the first space width $sd_1$, and the second and fourth space widths $sd_2$ and $sd_4$ may be smaller than the first space width $sd_1$.

Figure 8B:
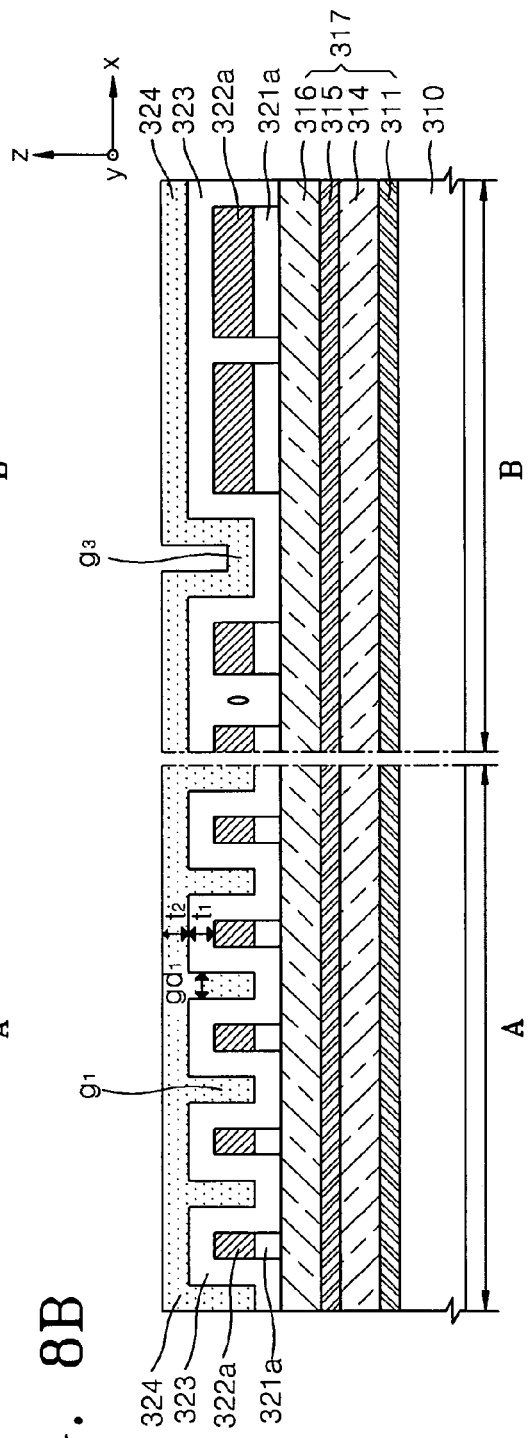

Referring to FIGS. 7B and 8B, a sacrificial layer 323 may be formed on the substrate 310 including the first hard mask patterns 322a. The sacrificial layer 323 may be a conformal layer that has good step coverage characteristics and is not affected by the density of a lower pattern. For example, the sacrificial layer 323 may be an oxide layer formed by an atomic layer deposition method.

In the high-density pattern region (A), the sacrificial layer 323 may have a thickness $t_1$ determined by a gap width Sd_314a (refer to FIG. 7A) between contact holes of the target contact hole pattern 314a to be formed. Further, in the high-density pattern region (A), gaps $g_1$ with a gap width $gd_1$ may be formed on the sacrificial layer 323 between sidewalls of the first hard mask patterns 322a. The gap width $gd_1$, i.e., a distance between respective facing sidewalls of the sacrificial layer 323, may be equal and/or substantially equal to the width $W_1$ of the first hard mask patterns 322a in the high-density pattern region (A).

Meanwhile, when the sacrificial layer 323 has a uniform thickness $t_1$ on the top surfaces and sidewalls of the first hard mask patterns 322a, the second and fourth space widths $sd_2$ and $sd_4$ between respective ones of the first hard mask patterns 322a in the low-density pattern region (B) may be equal to or smaller than twice the thickness $t_1$ of the sacrificial layer 323 ($sd_2 \leq 2t_1$, $sd_4 \leq 2t_1$). In such cases, a gap may not be formed on portions of the sacrificial layer 323 located in the second and fourth spaces $S_2$ and $S_4$ between the respective sidewalls of the first hard mask patterns 322a.

Instead, a void (V) may be formed in the portion of the sacrificial layer 323 located in the second and/or fourth spaces $S_2$, $S_4$. However, in the third space $S_3$, a gap $g_3$ may be formed.

A second hard mask layer 324 may be formed on the sacrificial layer 323. The second hard mask layer 324 may be formed of a material having etching characteristics similar to and/or the same as those of the first hard mask layer. For example, like the first hard mask layer, the second hard mask layer 324 may be formed of a polysilicon layer suitable for obtaining a vertical etch profile.

The second hard mask layer 324 may have a thickness $t_2$ sufficient for filling the gaps $g_1$ on the sacrificial layer 323 in the high-density pattern region (A). In such cases, the gaps $g_1$ on the sacrificial layer 323 formed in the first spaces $S_1$ may be sufficiently filled with the second hard mask layer 324, and the second and fourth spaces $S_2$ and $S_4$ may not be filled with the second hard mask layer 324 because no gap may be formed in the second and fourth spaces $S_2$ and $S_4$.

Referring to FIG. 8B, in the third space $S_3$, the second hard mask layer 324 may be formed on respective sidewalls of the sacrificial layer 323 and on a portion of the sacrificial layer extending along the XY plane. In embodiments in which the sacrificial layer 323 and the second hard mask layer 324 each have a substantially uniform thickness t1, t2, respectively, along both the XY plane parallel to the substrate 310 and the sidewalls of the first hard mask patterns 322a defining the third space width S3, the third space width $sd_3$ may be larger than or equal to twice the sum of the thickness t1 of the sacrificial layer 323 and the thickness t2 of the second hard mask layer 324 ($sd_3>2(t1+t2)$).

Figure 7C:
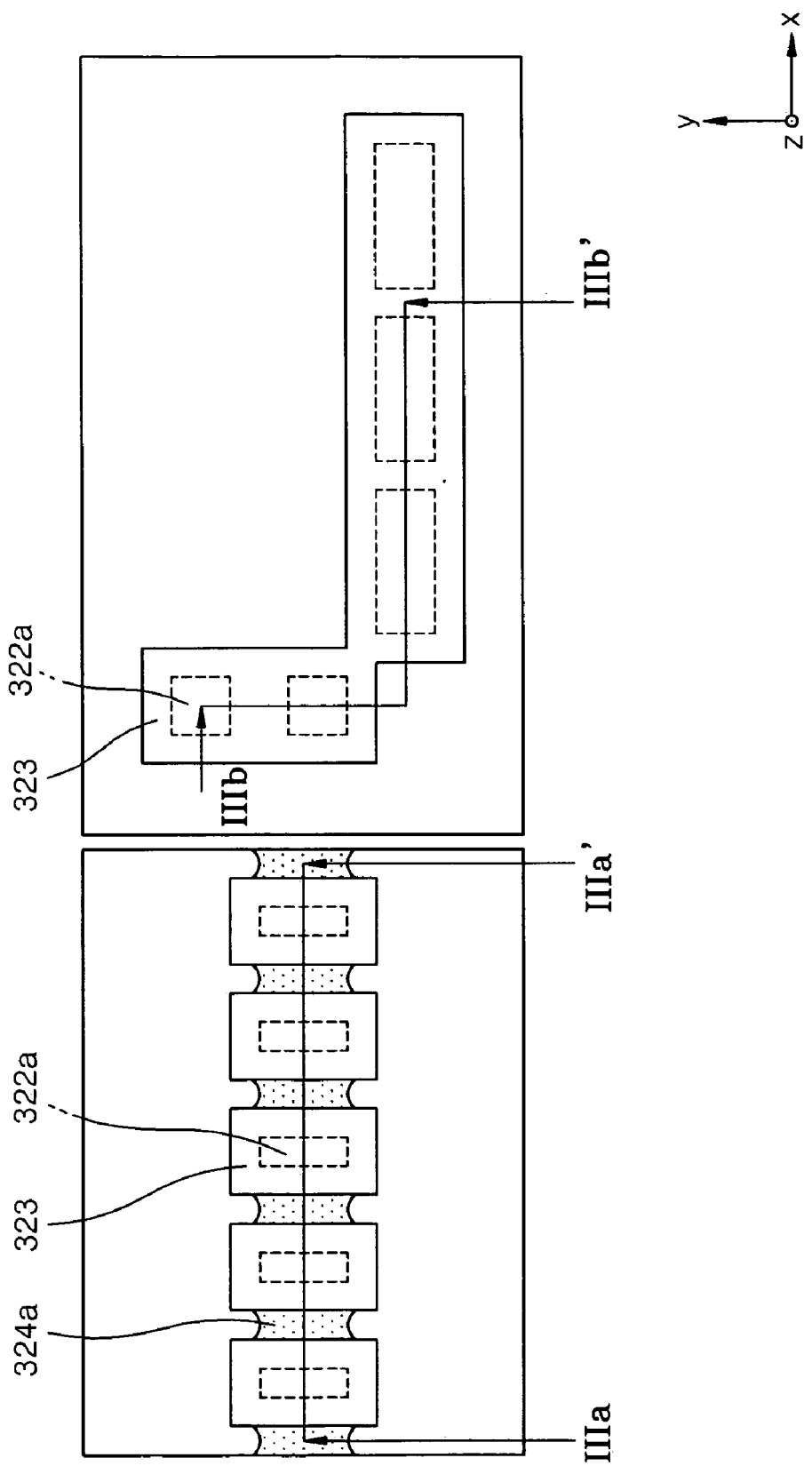

Referring to FIGS. 7C and 8C, the second hard mask layer 324 may be partially removed by isotropic etching until at least a top surface of the sacrificial layer 323 on the first hard mask pattern 322a is exposed. In such embodiments, the second hard mask layer 324 may be completely removed from the third space $S_3$ because the third space $S_3$ may not have been completely or substantially filled as a result of prior processing, whereas portions of the second hard mask layer 324 may remain in the first spaces $S_1$ because the first spaces $S_1$ may have been substantially or completely filled as a result of prior processing. As a result, a second hard mask pattern(s) 324a may be formed, and the formed second hard mask pattern(s) 324a may be substantially and/or completely aligned, e.g., parallel, with the first hard mask pattern(s) 322a along the XY plane. In embodiments of the invention, top and/or bottom surfaces of the second hard mask patterns 224a may be formed on the same and/or substantially the same XY plane as top and/or bottom surfaces of the first hard mask patterns 222a, respectively.

When the second hard mask layer 324 is a polysilicon layer, the isotropic etching may be performed using, e.g., a mixed solution of $HNO_3$ and SC-1 (wet etching).

Figure 7D:
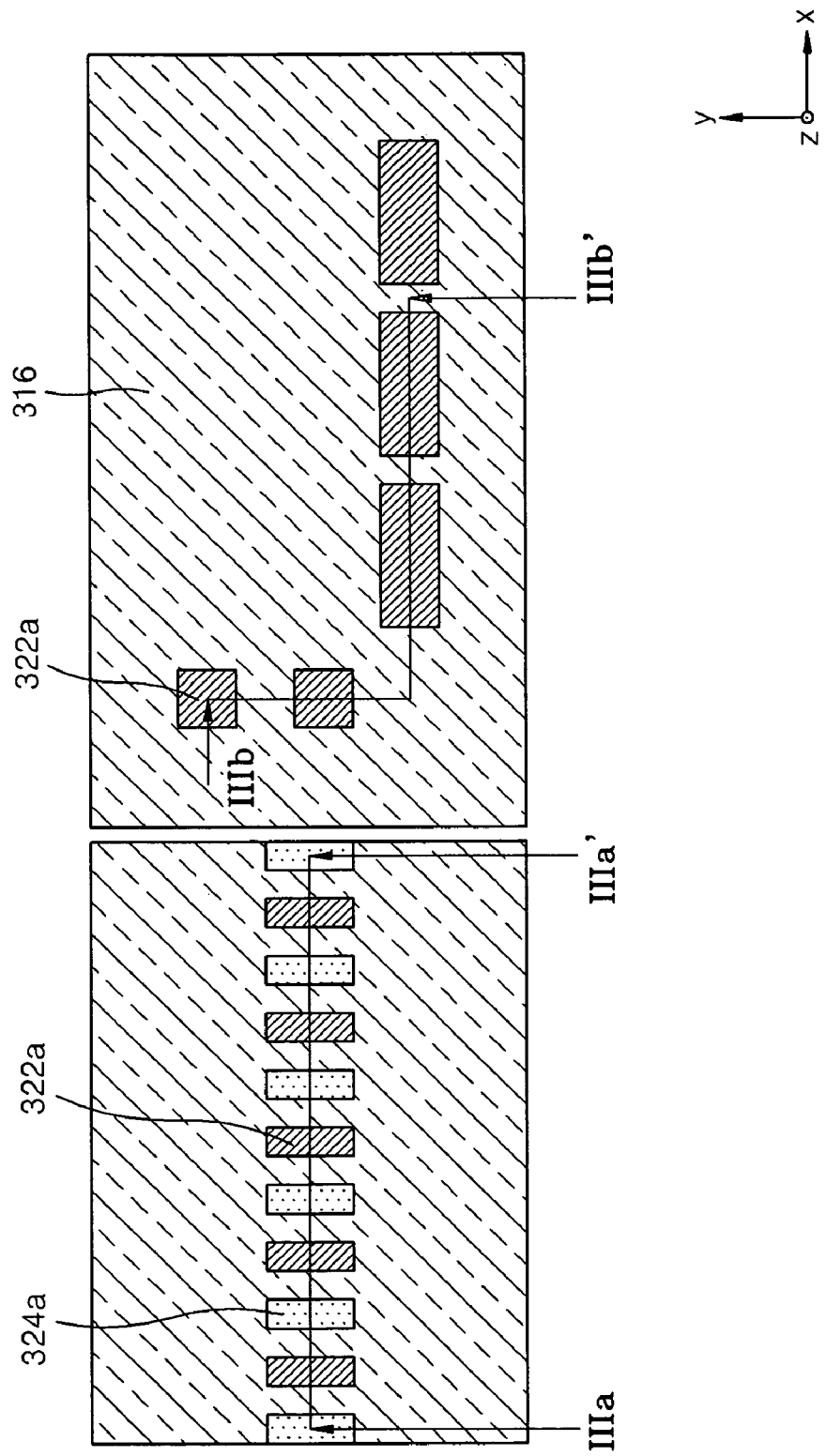

Referring to FIGS. 7D and 8D, the sacrificial layer 323 may be anisotropically etched using the second hard mask patterns 324a as etch masks to expose a respective portion(s) of the first hard mask patterns 322a. The sacrificial layer 323 may be further anisotropically etched using the second hard mask pattern 324a and the first hard mask patterns 322a as etch masks in order to expose a respective portion(s) of the second etch layer 316. As a result, in the high-density pattern region (A), a sacrificial pattern 323a stacked under the second hard mask pattern 324a between the first hard mask patterns 322a may be formed, and respective portions of the second etch layer 316 between the first and second hard mask patterns 322a and 324a may be exposed.

Meanwhile, in the low-density pattern region (B), respective portions of the second etch layer 314 may be exposed between the first hard mask patterns 322a. Thus, in embodiments of the invention, the second hard mask pattern 324a may not be formed, e.g., respective portions of the second hard mask layer 324 may be completely etched, in the low-density pattern region (B) by, e.g., adjusting the second, third, and fourth space widths $sd_2$, $sd_3$, and $sd_4$ between the first hard mask patterns 322a.

Figure 7E:
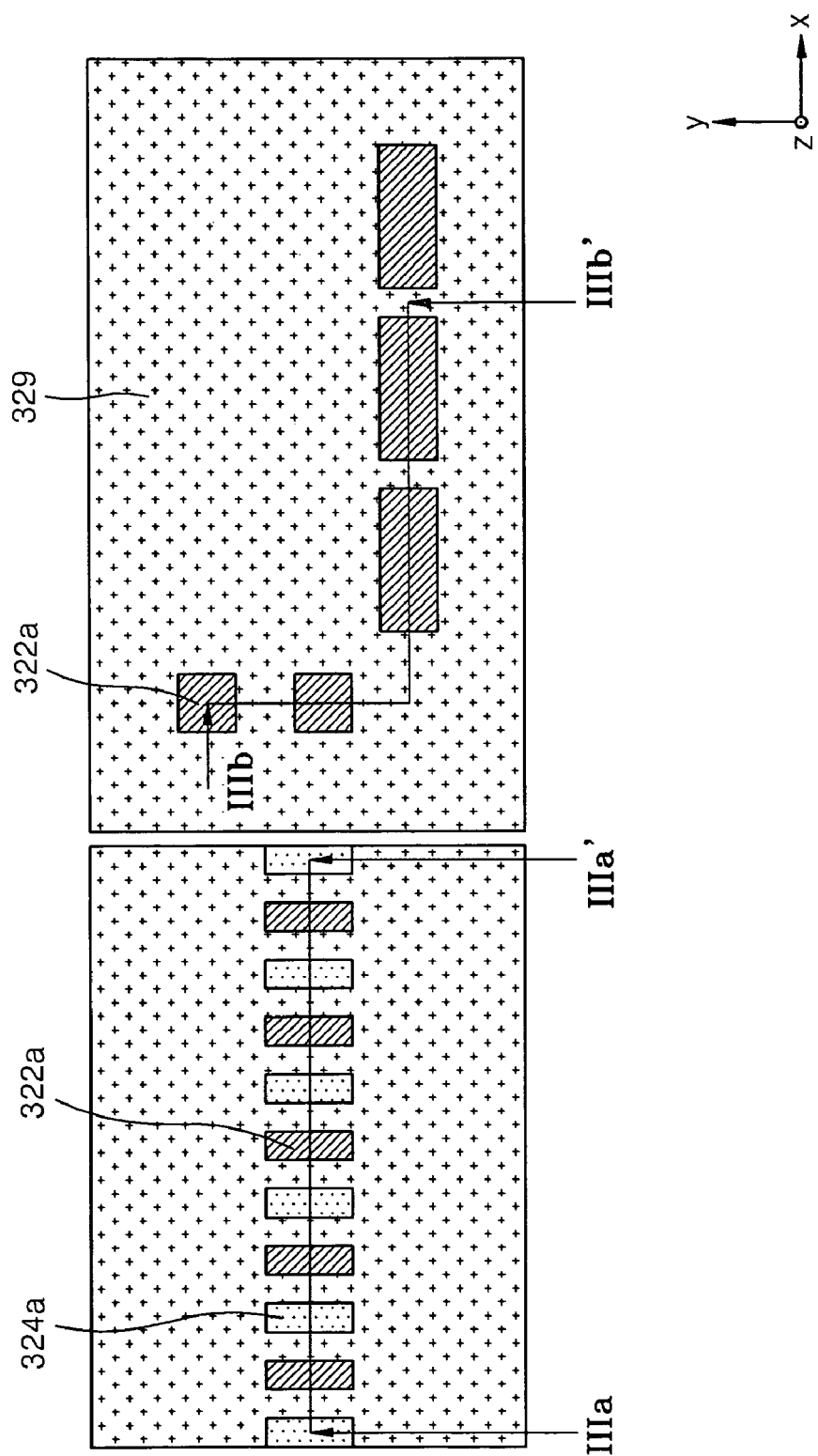

Referring to FIGS. 7E and 8E, the insulation layer 317 may be partially etched using the second hard mask pattern 324a and the exposed first hard mask patterns 322a as etch masks. More particularly, the second etch layer 316 may be anisotropically etched by using the second hard mask pattern 324a and the exposed first hard mask patterns 322a as etch masks, and using the second etch stop layer 315 as an etching stop point. As a result, respective portions of the second etch stop layer 315 may be exposed between the second hard mask pattern 324a and the first hard mask pattern 322a. In embodiments of the invention, the insulation layer 317 may have a uniform and/or substantially uniform height regardless of a pattern density of the second etch stop layer 315. In other words, when the second etch stop layer 315 is omitted, the etch layers 314 and 316 may be formed into a single etch layer, and thus the height of the insulation layer 317 may vary based on the pattern density of the combined etch layers 314, 316 when the insulation layer 317 is partially etched away.

Next, a contact hole etch mask layer 329 may be formed on the insulation layer 317, i.e., the second etch stop layer 315. Then, the contact hole etch mask layer 329 may be etched back to at least partially expose the hard mask patterns 322a and 324a, the sacrificial patterns 323a, and the auxiliary pattern 321a. The contact hole etch mask layer 329 may be formed of a material having good planarization characteristics and high etch resistance relative to a lower layer to be etched. Further, the contact hole etch mask layer 329 may be formed of a material that can be easily removed by ashing. Therefore, the contact hole etch mask layer 329 may be an organic layer (specifically, an organic polymer layer). For example, the contact hole etch mask layer 329 may be a photoresist material layer or an organic reflective material layer. Specifically, the contact hole etch mask layer 329 may be a PolyStyrene (PS) layer, a PolyMethylMethAcrylate (PMMA) layer, a Polylmide (PI) layer, a novolac resin layer, or a combination thereof. In embodiments of the invention, the etch back process may be formed using, e.g., an ashing method.

Figure 7F:
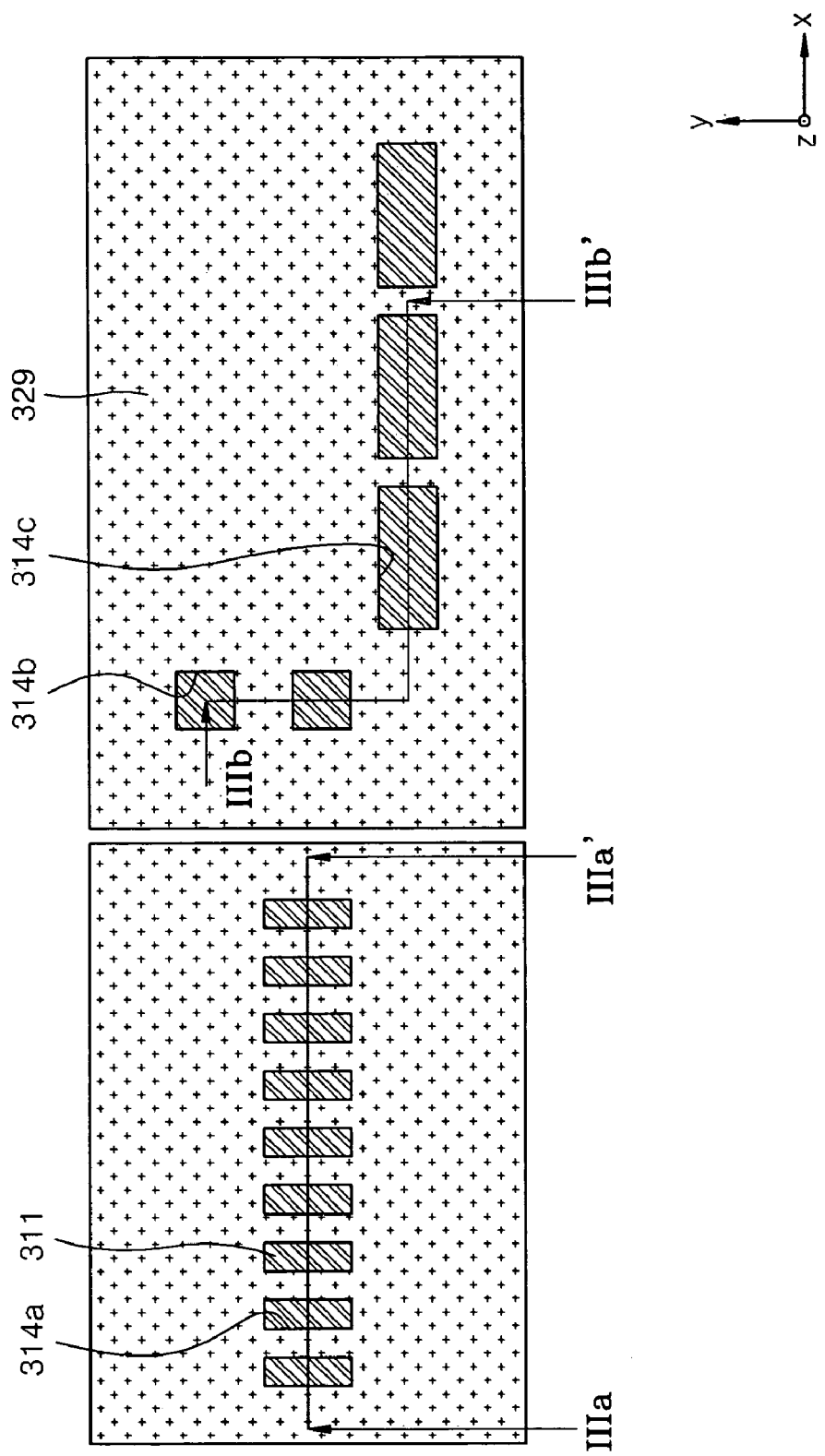

Referring to FIGS. 7F and 8F, using the contact hole etch mask layer 329 as an etch mask and the first etch stop layer 311 as an etch stop point, the hard mask patterns 322a and 324a, the sacrificial patterns 323a, and the auxiliary pattern 321a may be removed, and portions of the second etch layer 316, portions of the second etch stop layer 315, and portions of the first etch layer 314 under the hard mask patterns 322a and 324a may be anisotropically etched to form the contact hole patterns 314a, 314b, and 314c. The first etch stop layer 311 may be exposed by the contact hole patterns 314a, 314b, and 314c.

Figure 8G:
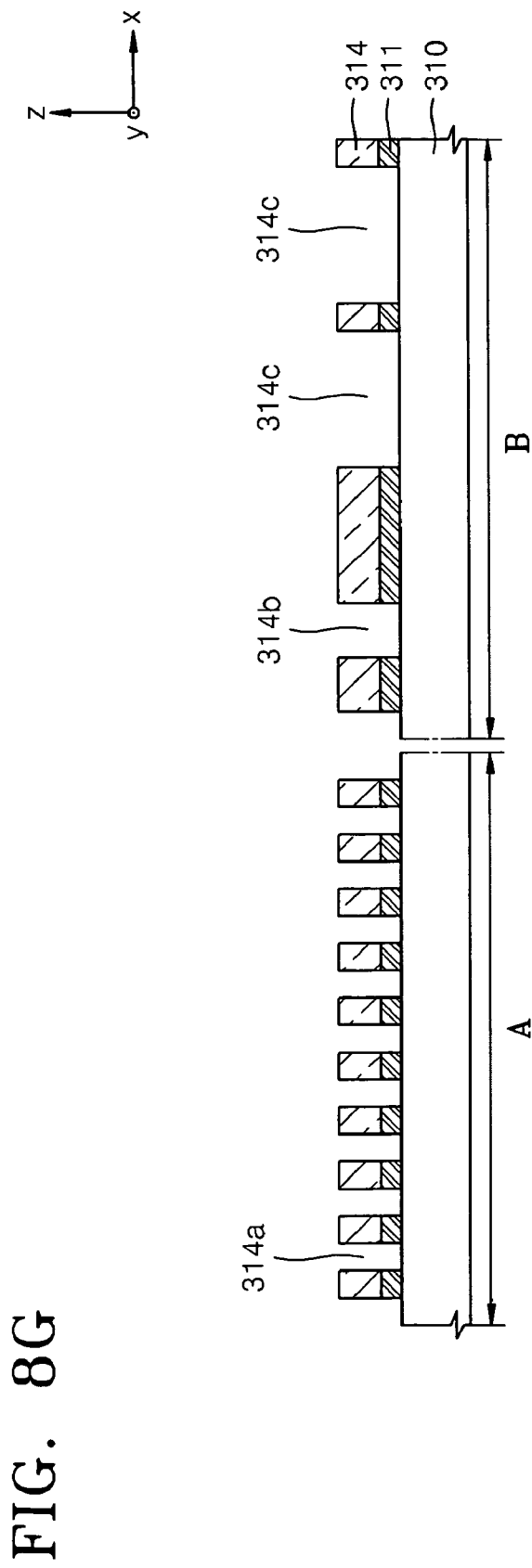

Referring to FIGS. 7G and 8G, the contact hole etch mask layer 329 may be removed to expose the second etch stop layer 315 adjacent to the contact hole patterns 314a, 314b, and 314c. Next, the first etch stop layer 311 exposed by the contact hole patterns 314a, 314b, and 314c and the second etch stop layer 315 adjacent to the contact hole patterns 314a, 314b, and 314c may be etched back so as to expose top surfaces of the first etch layer 314 and the semiconductor substrate 310.

The contact hole patterns 314a, 314b, and 314c formed in the current embodiment may be the same as to the contact hole patterns 214a, 214b, and 214c formed in the embodiment of FIGS. 5A through 6F. However, in the embodiment of FIGS. 5A through 6F, the first hard mask patterns 222a may be formed in alignment with the some of the gaps between the target contact hole patterns 214a, 214b, and 214c, and in the current embodiment, the first hard mask patterns 322a are formed in alignment with some of the target contact hole patterns 314a, 314b, and 314c. Therefore, the current embodiment does not require the second photolithography process that is required in the embodiment of FIGS. 5A through 6F to determine the widths of the contact hole patterns in a vertical, e.g., Z-direction.

In the method of forming fine patterns in a semiconductor device according to the present invention, after the first hard mask patterns are formed on the etch layer, the second hard mask pattern(s) may be formed in self-alignment with the first hard mask patterns. Then, the etch layer may be patterned using the first and second hard mask patterns as etch masks. In this way, fine-pitch patterns may be easily formed in the high-density pattern region at a resolution lower than the resolution limit of a photolithography process. In the low-density pattern region, the second hard mask pattern may not be formed by adjusting the space width between the first hard mask patterns or performing an additional photolithography process. Therefore, in embodiments of the invention, in the low-density pattern region, the etch layer may be patterned using only the first hard mask patterns, so that the device patterns can have various widths and pitches.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A self-align patterning method for forming patterns, comprising:
    forming a first layer on a substrate;
    forming a plurality of first hard mask patterns on the first layer;
    forming a sacrificial layer on top surfaces and sidewalls of the first hard mask patterns, thereby forming a gap between respective facing portions of the sacrificial layer on the sidewalls of the first hard mask patterns;
    forming a second hard mask pattern in the gap;
    etching the sacrificial layer using the second hard mask pattern as a mask to expose the first hard mask patterns;
    exposing the first layer using the exposed first hard mask patterns and the second hard mask pattern; and
    etching the exposed first layer using the first and second hard mask patterns.

2. The method as claimed in claim 1, wherein the sacrificial layer is formed by an atomic layer deposition method.

3. The method as claimed in claim 1, wherein each of the first and second hard mask patterns includes at least one of an oxide, a nitride, and a polysilicon.

4. The method as claimed in claim 1, wherein the first and second hard mask patterns are polysilicon layers.

5. The method as claimed in claim 1, wherein forming the second hard mask pattern comprises:
    forming a hard mask layer on the sacrificial layer while filling the gap with the hard mask layer; and
    isotropically etching the hard mask layer to expose the sacrificial layer.

6. The method as claimed in claim 5, wherein the isotropic etching is wet etching.

7. The method as claimed in claim 1, wherein the first layer is a conductive layer.

8. The method as claimed in claim 7, wherein:
    forming the plurality of first hard mask patterns includes forming the plurality of first hard mask patterns on the conductive layer, each of the first hard mask patterns including a first line mask pattern having a first line width and a first pad mask pattern having a second line width, the first pad mask pattern extending from the first line mask pattern, at least one of a distance between the first pad mask pattern and the first line mask pattern and a distance between the first pad mask patterns of neighboring ones of first hard mask patterns being greater than a distance between the first line mask patterns of neighboring ones of the first hard mask patterns,
    forming the second hard mask pattern includes forming a second hard mask pattern in the gap, the second hard mask pattern including a second pad mask pattern and a second line mask pattern, the second pad mask pattern being formed between the first pad mask pattern and the first line mask pattern or between the first pad mask patterns of the neighboring first hard mask patterns, the second line mask pattern being formed between the first line mask patterns of the neighboring first hard mask patterns, and
    etching the exposed first layer includes using the first and second hard mask patterns to form pad patterns.

9. The method as claimed in claim 8, wherein the pad patterns are uniformly spaced from each other.

10. The method as claimed in claim 9, wherein a distance between the pad patterns corresponds to a thickness of the sacrificial layer.

11. The method as claimed in claim 8, wherein forming the first hard mask patterns comprises forming an auxiliary pattern under each of the first hard mask patterns.

12. The method as claimed in claim 11, wherein the auxiliary pattern has a same thickness as the sacrificial layer.

13. The method as claimed in claim 1, wherein the first layer is an insulation layer.

14. The method as claimed in claim 13, further comprising:
    forming a photoresist pattern on the second hard mask pattern, the photoresist pattern including a slit formed across the second hard mask pattern to expose a portion of the second hard mask pattern and portions of the sacrificial layer adjoining the second hard mask pattern, and
wherein:
    forming the first layer includes forming the insulation layer on a substrate having a high-density pattern region and a low-density pattern region,
    forming the plurality of first hard mask patterns includes forming the plurality of first hard mask patterns on the insulation layer of the high-density pattern region,
    etching the sacrificial layer includes etching the sacrificial layer using the photoresist pattern and the second hard mask pattern as masks to expose the first hard mask pattern,
    exposing the first layer includes using the photoresist pattern, the second hard mask pattern, and the first hard mask patterns as masks to remove portions of the sacrificial layer located between the first and second hard mask patterns so as to expose the insulation layer, and
    etching the exposed first layer includes etching the exposed insulation layer using the photoresist pattern, the first hard mask patterns, and the second hard mask pattern as masks to form contact holes.

15. The method as claimed in claim 14, wherein:
    the first hard mask patterns are formed on the insulation layer of the low-density pattern region, and
    a space width between the first hard mask patterns of the low-density pattern region is such that the second hard mask pattern is not formed on the low-density pattern region.

16. The method as claimed in claim 15, wherein the photoresist pattern further includes an opening exposing a portion of the sacrificial layer located between the first hard mask patterns of the low-density pattern region.

17. The method as claimed in claim 14, further comprising forming a planarization film on the second hard mask layer prior to forming the photoresist pattern.

18. A method of forming contact holes, comprising:
    forming an insulation layer on a substrate;
    forming a plurality of first hard mask patterns on the insulation layer;
    forming a sacrificial layer on top surfaces and sidewalls of the first hard mask patterns, thereby forming a gap between the sacrificial layer formed on the neighboring sidewalls of the first hard mask patterns;
    forming a second hard mask pattern in the gap;

etching the sacrificial layer using the second hard mask pattern as a mask to expose the first hard mask patterns and using the first and second hard mask patterns as masks to remove portions of the sacrificial layer located between the first and second hard mask patterns so as to expose the insulation layer;

partially etching the exposed insulation layer using the first and second hard mask patterns as masks;

forming a contact hole etch mask layer on the partially-etched insulation layer; and etching the first hard mask patterns, the second hard mask pattern, the sacrificial layer under the second hard mask pattern, and portions of the insulation layer under the first and second hard mask patterns by using the contact hole etch mask layer as an etch mask, so as to form contact holes in the insulation layer.

19. The method as claimed in claim 18, wherein forming the insulation layer comprises:

forming a first insulation layer on the substrate;

forming an etch stop layer on the first insulation layer; and forming a second insulation layer on the etch stop layer.

20. The method as claimed in claim 19, wherein partially etching of the exposed insulation layer comprises etching the second insulation layer to expose the etch stop layer.

21. The method as claimed in claim 20, wherein the contact hole etch mask layer is an organic layer.

* * * * *